(12) United States Patent
Kurose

(10) Patent No.: US 11,018,030 B2
(45) Date of Patent: May 25, 2021

(54) FAN-OUT WAFER LEVEL CHIP-SCALE PACKAGES AND METHODS OF MANUFACTURE

(71) Applicant: SEMICONDUCTOR COMPONENTS INDUSTRIES, LLC, Phoenix, AZ (US)

(72) Inventor: Eiji Kurose, Oizumi-machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 11 days.

(21) Appl. No.: 16/512,621

(22) Filed: Jul. 16, 2019

(65) Prior Publication Data

US 2020/0303216 A1    Sep. 24, 2020

Related U.S. Application Data

(60) Provisional application No. 62/820,985, filed on Mar. 20, 2019.

(51) Int. Cl.
*H01L 23/544* (2006.01)
*H01L 21/56* (2006.01)
(Continued)

(52) U.S. Cl.
CPC ........ *H01L 21/565* (2013.01); *H01L 21/4814* (2013.01); *H01L 21/561* (2013.01);
(Continued)

(58) Field of Classification Search
CPC ............ H01L 2924/1816; H01L 24/97; H01L 23/544; H01L 23/3114; H01L 23/31;
(Continued)

(56) References Cited

U.S. PATENT DOCUMENTS

| 6,309,943 B1 * | 10/2001 | Glenn | ................... H01L 21/481 |
| | | | 257/E23.179 |
| 6,441,504 B1 * | 8/2002 | Glenn | ................... B23D 59/001 |
| | | | 257/730 |

(Continued)

FOREIGN PATENT DOCUMENTS

| CN | 105047652 A | * 11/2015 | ............. H01L 24/97 |
| CN | 105244341 A | * 1/2016 | ............. H01L 24/97 |

(Continued)

*Primary Examiner* — Earl N Taylor
(74) *Attorney, Agent, or Firm* — Brake Hughes Bellermann LLP

(57) ABSTRACT

In a general aspect, a for producing a fan-out wafer level package (FOWLP) semiconductor device can include separating a semiconductor wafer into a plurality of semiconductor die and, after separating the semiconductor wafer into the plurality of semiconductor die, increasing spacing between the plurality of semiconductor die. The method can further include encapsulating, in a molding compound, the plurality of semiconductor die and determining respective locations of one or more alignment features disposed within the molding compound. The method can still further include forming, based on the determined respective locations, one or more alignment marks in the molding compound.

20 Claims, 17 Drawing Sheets

(51) Int. Cl.
*H01L 21/48* (2006.01)
*H01L 23/00* (2006.01)
*H01L 21/683* (2006.01)
*H01L 23/31* (2006.01)

(52) U.S. Cl.
CPC .......... *H01L 21/6836* (2013.01); *H01L 23/31* (2013.01); *H01L 23/544* (2013.01); *H01L 24/97* (2013.01); *H01L 2223/54426* (2013.01); *H01L 2224/97* (2013.01)

(58) Field of Classification Search
CPC ....... H01L 2223/54426; H01L 21/6836; H01L 21/565; H01L 21/561; H01L 21/4814
See application file for complete search history.

(56) References Cited

U.S. PATENT DOCUMENTS

| | | | | |
|---|---|---|---|---|
| 9,391,028 | B1* | 7/2016 | Chen | H01L 23/544 |
| 2006/0216854 | A1* | 9/2006 | Nishikawa | H01L 24/20 |
| | | | | 438/106 |
| 2008/0050901 | A1* | 2/2008 | Kweon | H01L 21/566 |
| | | | | 438/597 |
| 2009/0160071 | A1* | 6/2009 | Shen | H01L 23/5389 |
| | | | | 257/786 |
| 2011/0018118 | A1* | 1/2011 | Hsieh | H01L 21/6835 |
| | | | | 257/690 |
| 2011/0095413 | A1* | 4/2011 | Barth | H01L 21/568 |
| | | | | 257/685 |
| 2011/0198762 | A1 | 8/2011 | Scanlan | |
| 2011/0213487 | A1* | 9/2011 | Wahlsten | G03F 7/70383 |
| | | | | 700/104 |
| 2011/0298110 | A1* | 12/2011 | Pagaila | H01L 24/11 |
| | | | | 257/660 |
| 2013/0001776 | A1 | 1/2013 | Yu et al. | |
| 2013/0168849 | A1* | 7/2013 | Scanlan | H01L 23/48 |
| | | | | 257/737 |
| 2013/0280826 | A1* | 10/2013 | Scanlan | H01L 23/544 |
| | | | | 438/15 |
| 2014/0054802 | A1* | 2/2014 | Shim | H01L 24/03 |
| | | | | 257/787 |
| 2015/0008566 | A1* | 1/2015 | Gerber | H01L 23/5389 |
| | | | | 257/668 |
| 2015/0371915 | A1* | 12/2015 | Hashimoto | H01L 21/4882 |
| | | | | 257/531 |
| 2016/0086825 | A1* | 3/2016 | Scanlan | H01L 21/561 |
| | | | | 438/15 |
| 2016/0133593 | A1* | 5/2016 | Tang | H01L 24/92 |
| | | | | 257/737 |
| 2016/0172306 | A1* | 6/2016 | Scanlan | H01L 21/561 |
| | | | | 438/462 |
| 2017/0084544 | A1* | 3/2017 | Chen | H01L 23/3171 |
| 2017/0170127 | A1* | 6/2017 | Choi | H01L 23/544 |
| 2018/0068896 | A1* | 3/2018 | Tang | H01L 21/78 |
| 2018/0151342 | A1* | 5/2018 | Fan | H01L 24/95 |
| 2018/0254216 | A1* | 9/2018 | Scanlan | H01L 21/565 |
| 2019/0139901 | A1* | 5/2019 | Scanlan | H01L 23/3107 |
| 2019/0189530 | A1* | 6/2019 | Keat | H01L 24/32 |
| 2019/0355679 | A1* | 11/2019 | Wu | H01L 24/19 |
| 2020/0027841 | A1* | 1/2020 | Jones | H01L 21/76224 |
| 2020/0158959 | A1* | 5/2020 | Ardalan | H01L 21/56 |
| 2020/0294930 | A1* | 9/2020 | Wang | H01L 21/565 |
| 2020/0303216 | A1* | 9/2020 | Kurose | H01L 21/561 |

FOREIGN PATENT DOCUMENTS

| | | | | |
|---|---|---|---|---|
| CN | 105390471 | A | * 3/2016 | |
| CN | 106601635 | A | * 4/2017 | |
| EP | 1394855 | A2 | * 3/2004 | H01L 24/97 |

* cited by examiner

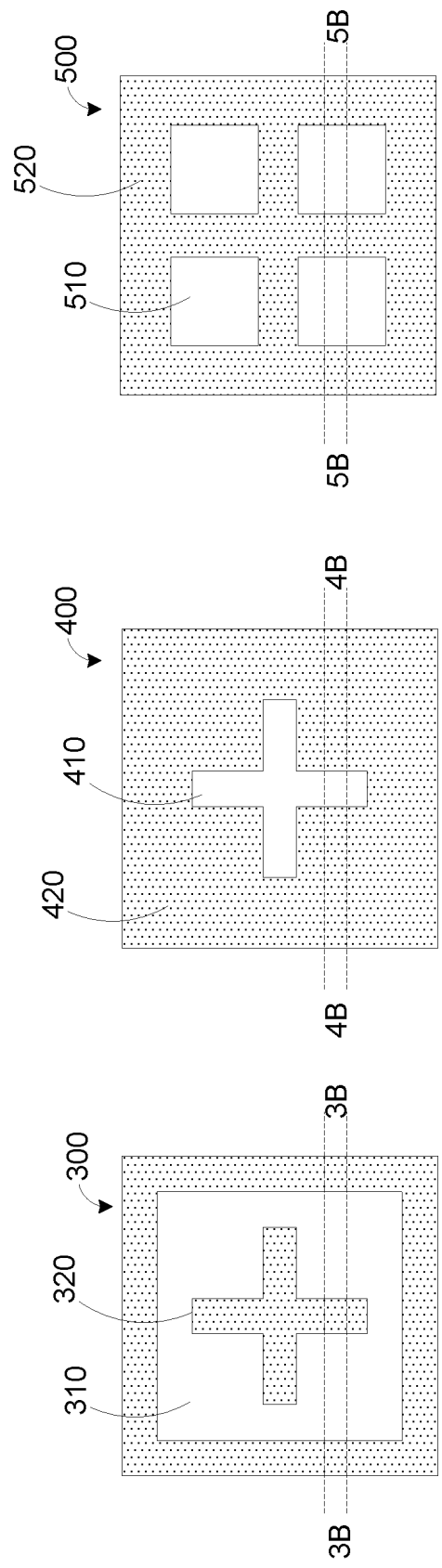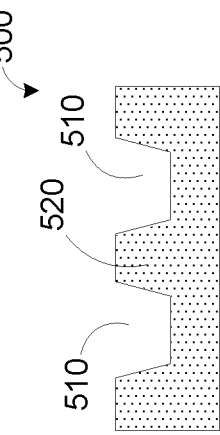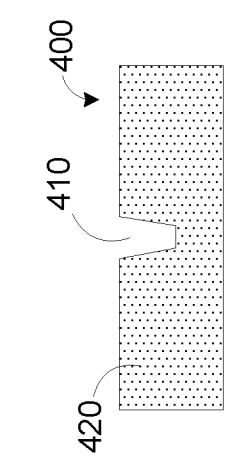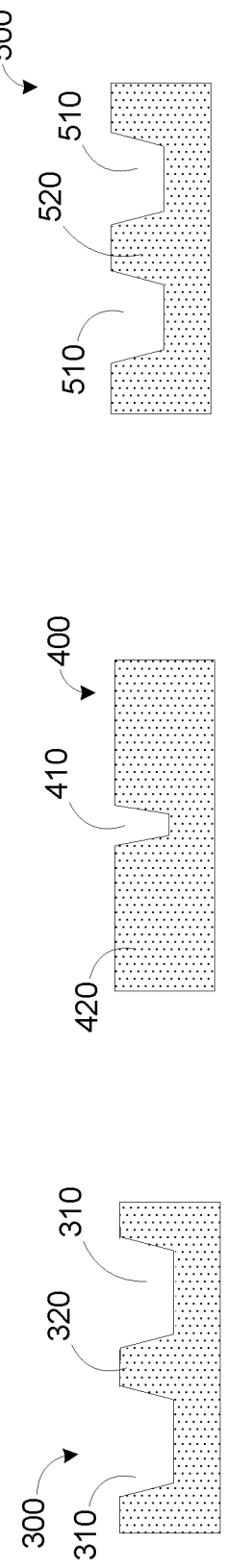

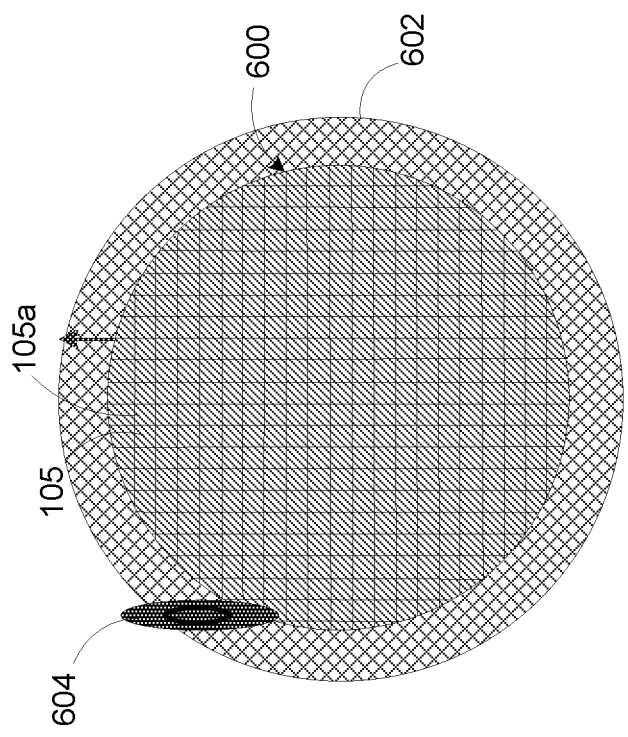
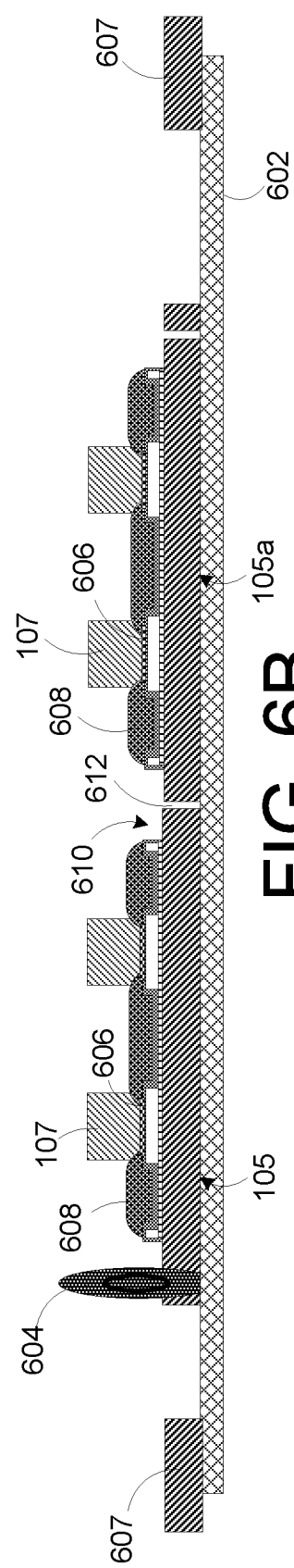
FIG. 6A
FIG. 6B

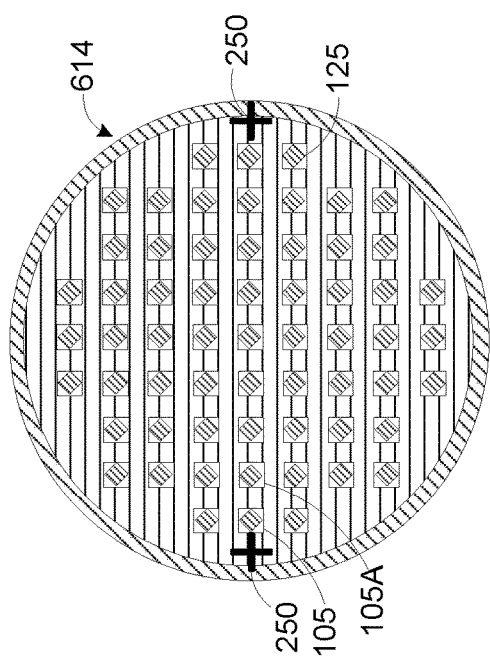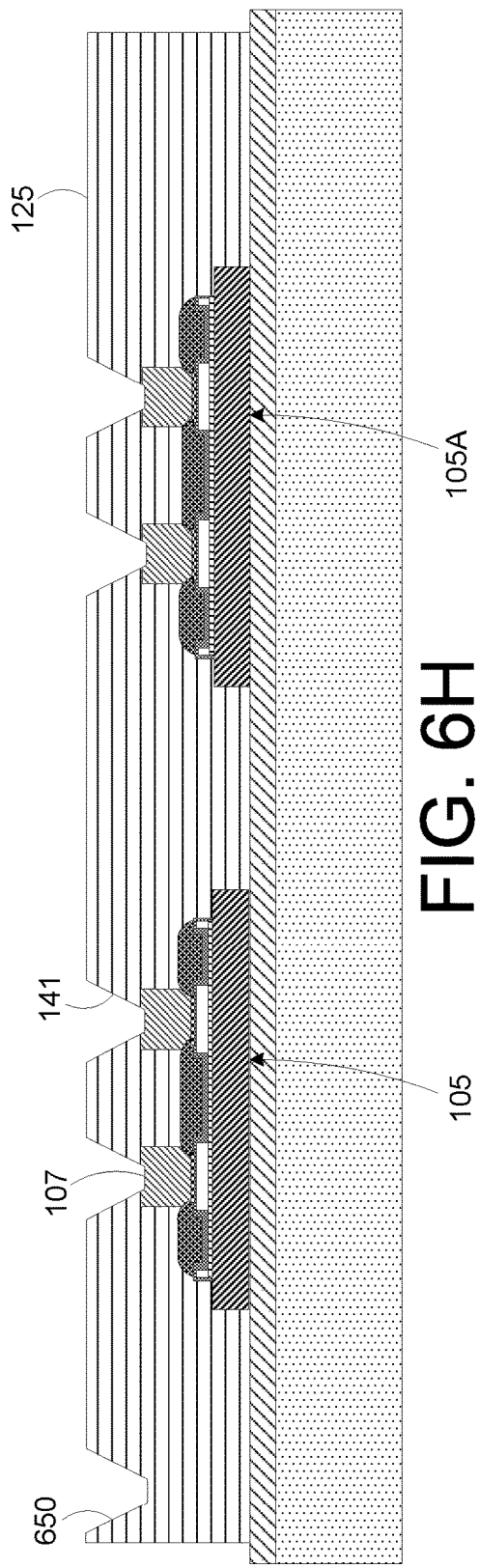
FIG. 6G
FIG. 6H

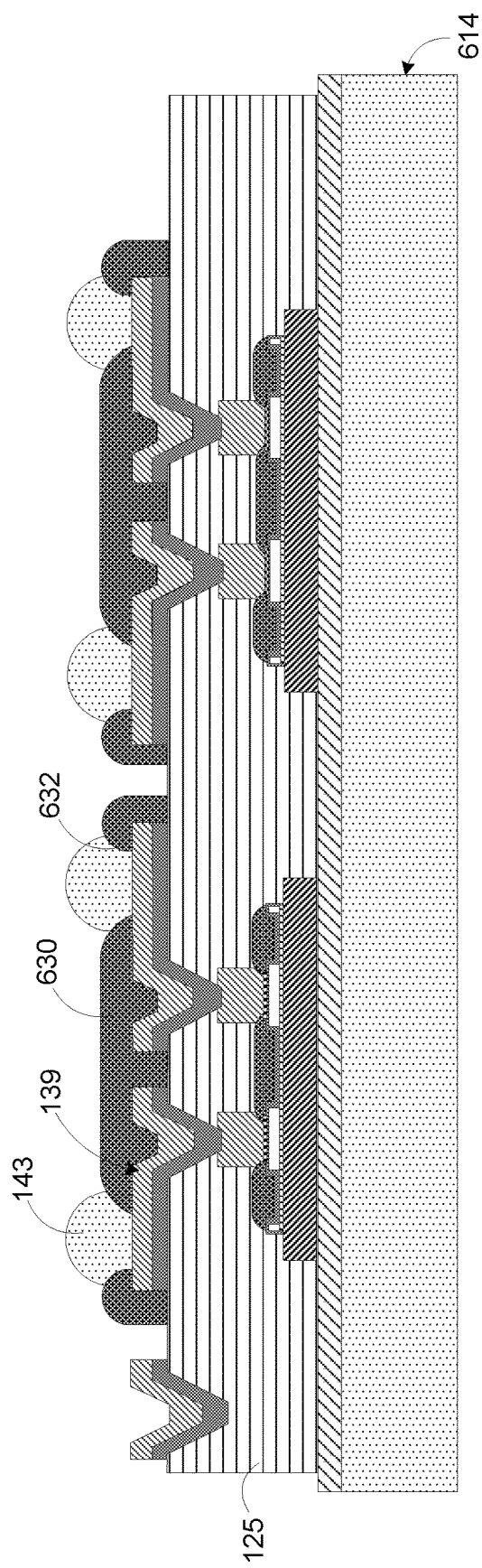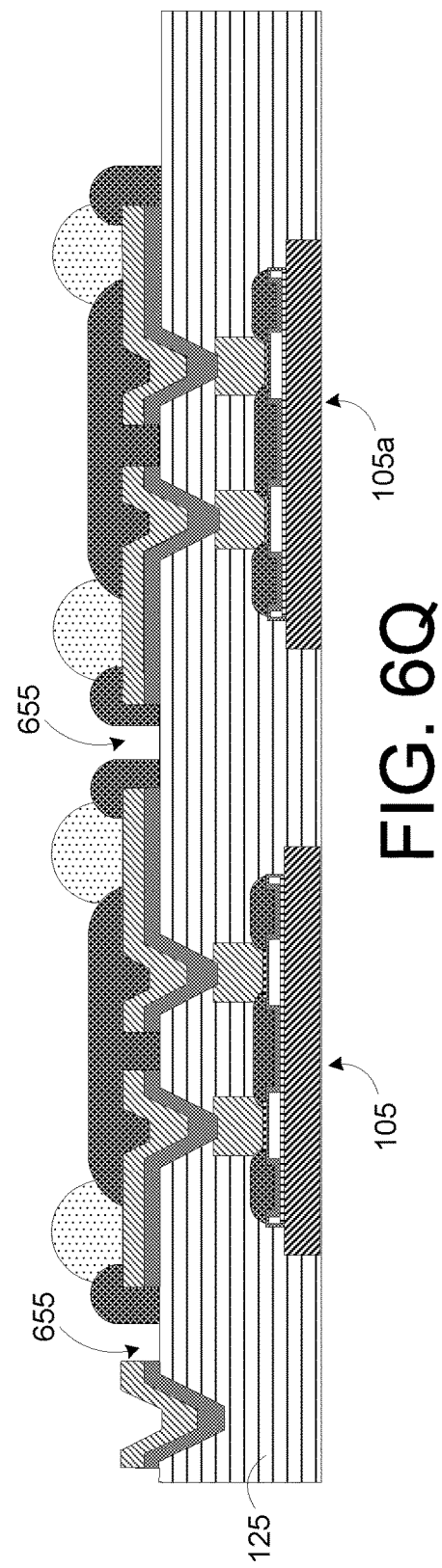
FIG. 6P
FIG. 6Q

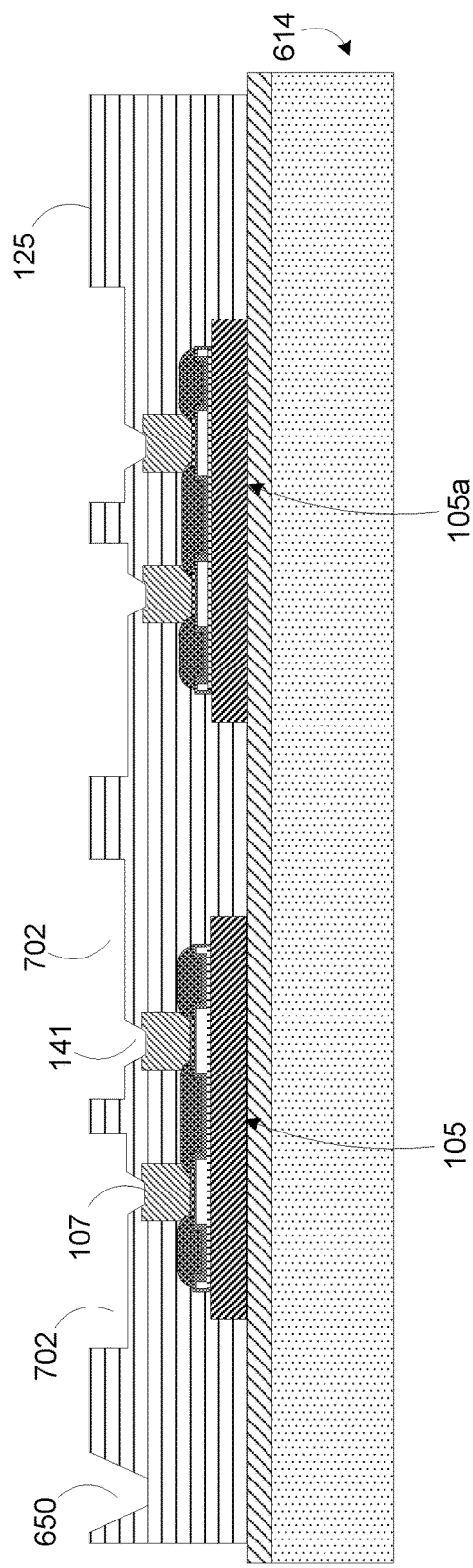
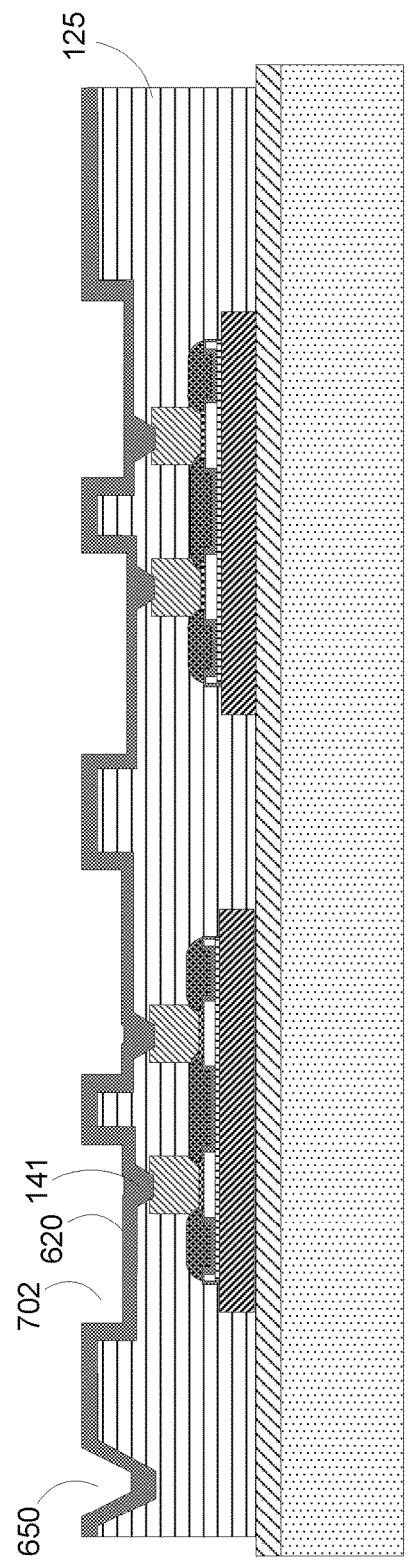
FIG. 7A
FIG. 7B

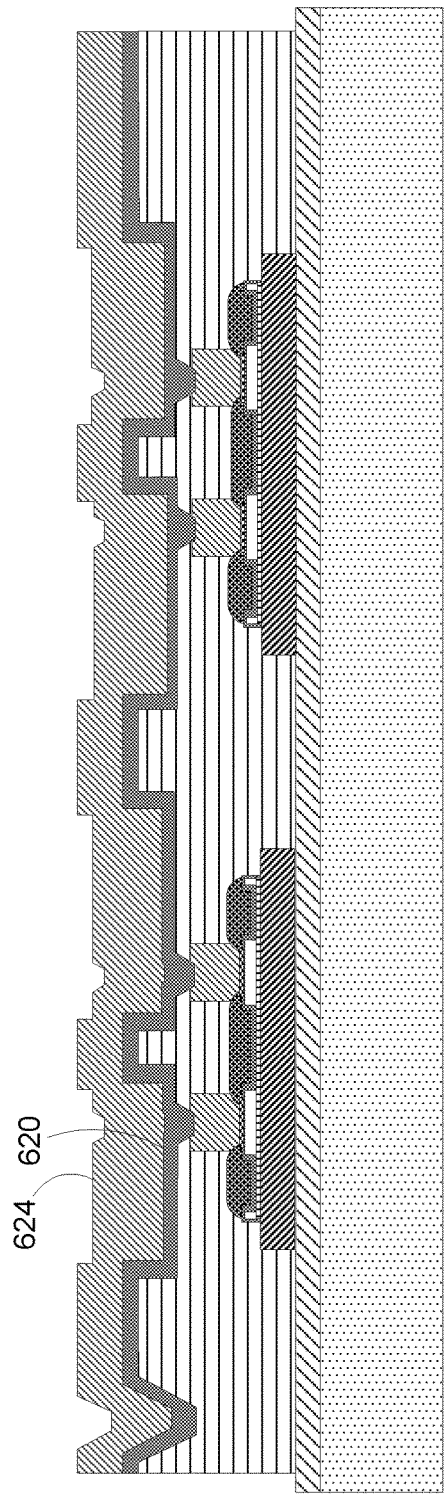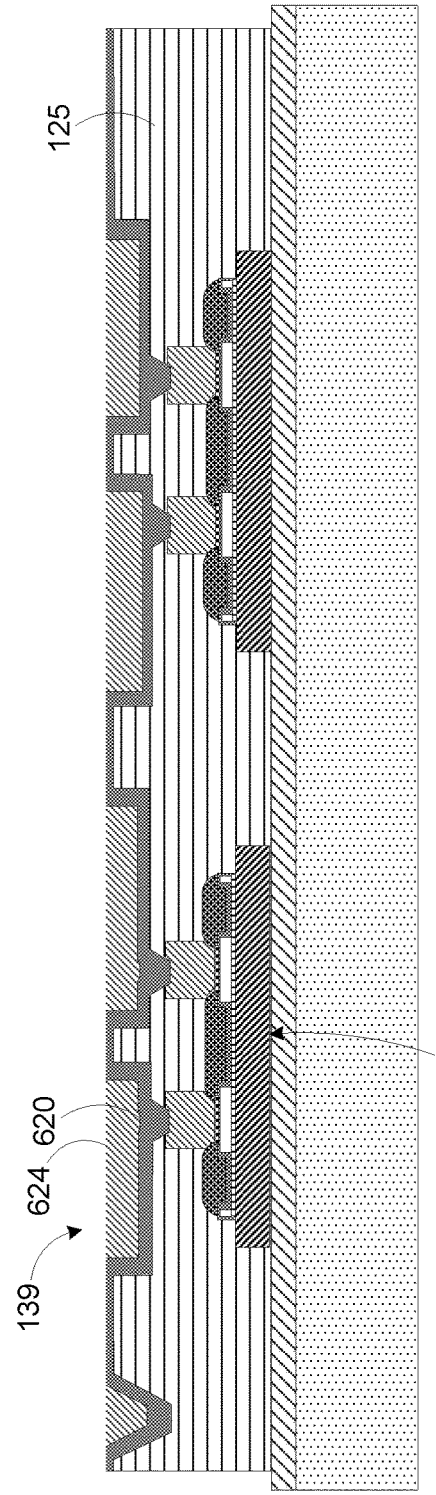

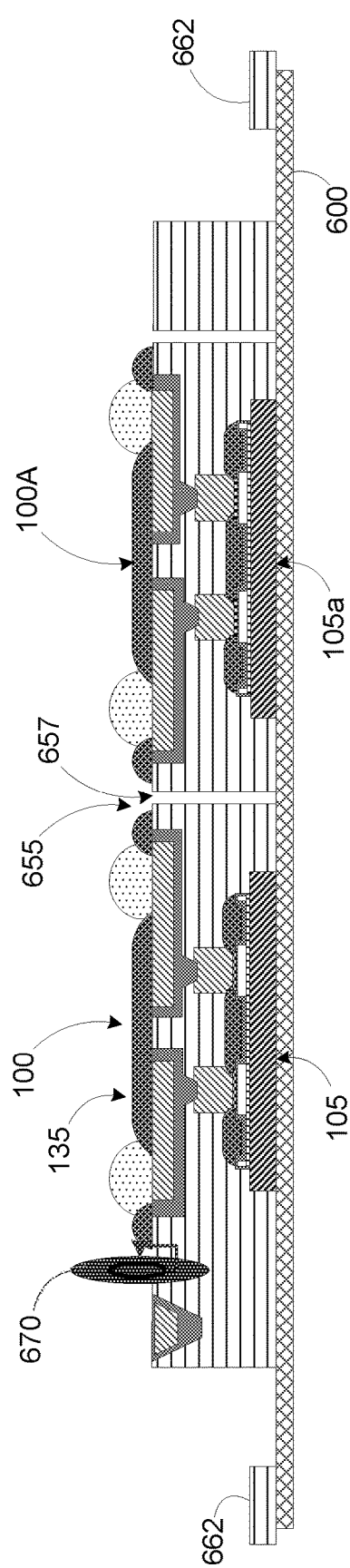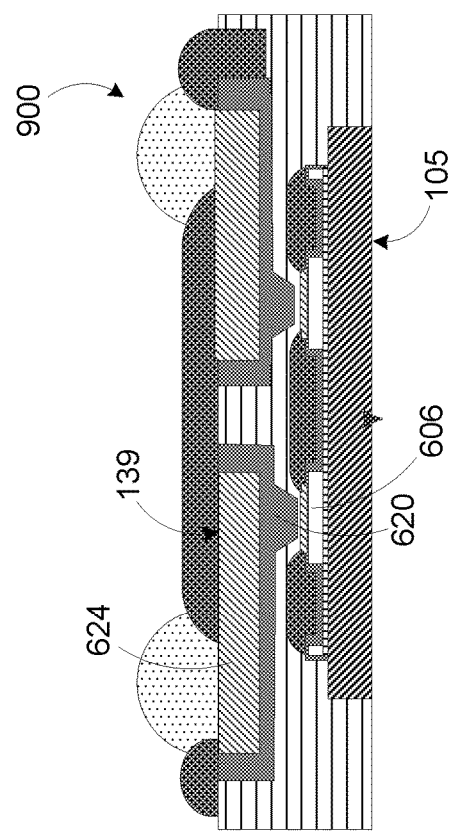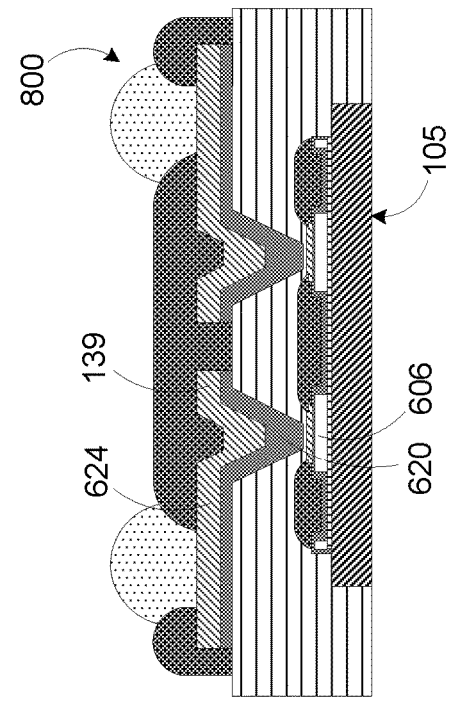

FAN-OUT WAFER LEVEL CHIP-SCALE PACKAGES AND METHODS OF MANUFACTURE

CROSS-REFERENCE TO RELATED APPLICATIONS

This application claims the benefit of U.S. Provisional Patent Application No. 62/820,985, filed on Mar. 20, 2019, the entire contents of which is incorporated herein by reference.

TECHNICAL FIELD

This description relates to semiconductor device packages and associated methods of producing such packages. More specifically, this description relates to semiconductor devices packaged in fan-out wafer level chip scale packages (FOWLCSPs) and corresponding methods of manufacture.

BACKGROUND

Semiconductor devices (e.g., semiconductor die) can be implemented in a number of different package configurations. For example, a semiconductor die, or multiple semiconductor die including devices such as power transistors, power diodes, integrated circuits, etc., can be included in a wafer level package, such as a fan-out wafer level package (FOWLP), or a fan-out wafer level chip-scale package (FOWLCSP). However, current approaches for producing such packages have certain drawbacks, such as misalignment that can occur when producing a redistribution layer (which can be referred to as a signal redistribution layer), where the redistribution layer provides electrical connections to one or more semiconductor die included in the package.

SUMMARY

In a general aspect, a for producing a fan-out wafer level package (FOWLP) semiconductor device can include separating a semiconductor wafer into a plurality of semiconductor die and, after separating the semiconductor wafer into the plurality of semiconductor die, increasing spacing between the plurality of semiconductor die. The method can further include encapsulating, in a molding compound, the plurality of semiconductor die and determining respective locations of one or more alignment features disposed within the molding compound. The method can still further include forming, based on the determined respective locations, one or more alignment marks in the molding compound.

In another general aspect, a fan-out wafer level package (FOWLP) semiconductor device can include a semiconductor die and a molding compound encapsulating, at least in part, the semiconductor die. The FOWLP can further include a plurality of via openings through the molding compound. Each via opening of the plurality of via openings can expose a respective electrical connection of the semiconductor die. The FOWLP can also include at least one recessed region in the molding compound. The FOWLP can further include a signal distribution structure. The signal distribution structure can be disposed on the molding compound, and disposed in at least one via opening through the molding compound. At least a portion of the signal distribution structure can be disposed in the at least one recessed region.

BRIEF DESCRIPTION OF THE DRAWINGS

FIGS. 3A and 3B are diagrams illustrating an alignment mark, according to an implementation.

FIGS. 4A and 4B are diagrams illustrating another alignment mark, according to an implementation.

FIGS. 5A and 5B are diagrams illustrating yet another alignment mark, according to an implementation.

FIGS. 7A-7G are diagrams illustrating another process for producing a fan-out wafer level chip-scale package, according to an implementation.

FIG. 8 is a diagram illustrating a chip-scale package that can be produced using the method of FIGS. 6A-6R, according to an implementation.

FIG. 9 is a diagram illustrating a chip-scale package that can be produced using the method of FIGS. 7A-7G, according to an implementation.

Figure 1:
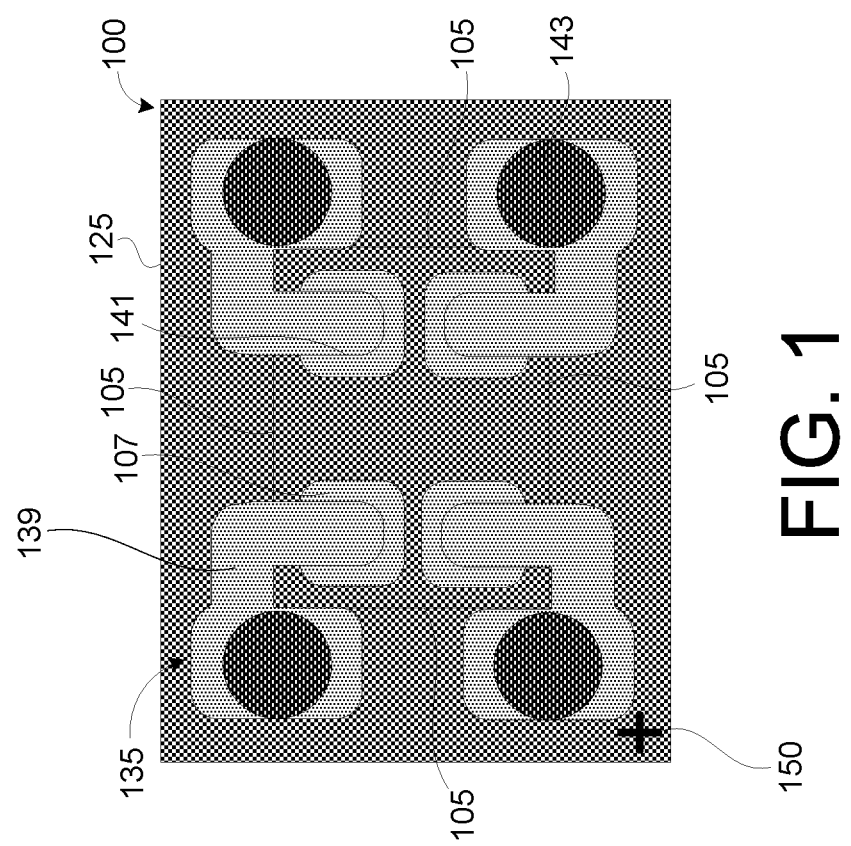
FIG. 1 is a diagram illustrating a plan view of a fan-out wafer level chip-scale package (FOWLCSP), according to an implementation.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but may be provided for context between related views. Also, not all like elements in the drawings may be specifically referenced with a reference symbol when multiple instances of an element are illustrated in a given view.

DETAILED DESCRIPTION

This disclosure relates to packaged semiconductor device apparatus and associated methods of manufacturing packaged semiconductor devices. More specifically, this disclosure relates to fan-out wafer level packages (FOWLPs), or fan-out wafer level chip-scale packages (FOWLCSPs) for packaging semiconductor devices (semiconductor die), and corresponding methods of manufacture. For purposes of this disclosure, FOWLPs and FOWLCSPs may be collectively referred to as packages, FOWLPs, or FOWLCSPs. In such FOWLPs, the area over which the input and output (I/O) signal connections (pads, bumps, etc.) of the FOWLP are distributed can be greater than (larger than, etc.) an area of the corresponding semiconductor die included in the FOWLP. That is, the I/O connections can be fanned-out as compared to corresponding connections of an associated semiconductor die to which the fanned-out I/O connections are respectively coupled with, such that the I/O connections of the FOWLP are distributed over an area that is larger than the semiconductor die and an area over which the I/O connections of the semiconductor die are distributed. For purposes of this disclosure, I/O signal connections can refer to input signals, output signals and/or supply voltages (e.g., Vcc, ground, etc.).

The FOWLPs and associated manufacturing approaches disclosed herein can overcome disadvantages of current manufacturing approaches, such as those noted above. For example, the disclosed approaches can prevent misalignment that can occur during photolithography operations used to define (form, produce, etc.) a signal redistribution layer, and/or a redistribution layer (RDL).

For instance, in the approaches described herein, alignment marks can be formed in a molding compound that is used to encapsulate a plurality of semiconductor die that are disposed on a substrate (e.g., a temporary substrate) during a FOWLP manufacturing process, such as in the example implementations described herein, where the semiconductor die have increased spacing, as compared to their spacing after separation (e.g., cutting, sawing, and so forth) of a semiconductor wafer into individual semiconductor die (e.g. die singulation). In some implementations, such alignment marks can be formed in the molding compound based on infrared imaging, where infrared imaging is used to detect the plurality of semiconductor die within the molding compound, and/or to detect other alignment structures within the molding compound, such as alignment features (alignments structures, etc.) included on a wafer carrier, or a temporary substrate used during manufacturing of FOWLPs.

The alignment marks in the molding compound can then be formed in locations relative to the detected (determined, etc.) locations of the plurality of semiconductor die, and/or other alignment structures. In some implementations, such alignment marks can be formed using laser ablation. Depending on the particular implementation, an alignment mark per semiconductor die can be formed, or one or more common alignment marks can be formed, where the alignment marks can be used for alignment of photolithography operations for the plurality of semiconductor die on a substrate (e.g., a temporary substrate, wafer carrier, etc.) during a FOWLP manufacturing process. For instance, such alignment marks can be used for alignment in subsequent manufacturing operations (e.g., photolithography operations) used to produce (form, define, etc.) RDLs for the plurality of semiconductor die.

FIG. 1 is a diagram illustrating a plan (top side) view of a FOWLP 100. In FIG. 1, the plan view of the FOWLP 100 is illustrated such that internal elements of the FOWLP 100 are shown, so as to illustrate relationships of the various elements of the FOWLP 100 to one another. In some implementations, these internal elements may, or may not be visible in such a plan view. That is, the FOWLP 100 in FIG. 1 is shown as a partial x-ray, or ghost view, to illustrate arrangement of the various elements of the FOWLP 100. As shown in FIG. 1, the FOWLP 100 includes an alignment mark 150, where a corresponding alignment mark 150 can be formed for (in correspondence with, etc.) each semiconductor die that is disposed on a carrier (substrate, etc.) during a FOWLP manufacturing process.

As also shown in FIG. 1, the FOWLP 100 can include a semiconductor die 105, a molding compound 125, and a signal redistribution structure 135, which can also be referred to as a redistribution layer, or RDL 135 (such as discussed above). In FIG. 1, perimeter edges (e.g. four perimeter edges) of the semiconductor die 105 are each respectively indicated with the reference number 105. As shown in FIG. 1, the semiconductor die 105 can include conductive bumps or posts 107, which can be implemented, for example, using solder bumps, conductive (e.g., copper) pillars, etc., where the conductive bumps or posts 107 are disposed on the semiconductor die. In some implementations, the conductive bumps or posts 107 can be disposed on an active (e.g., front-side or top-side) surface of the semiconductor die 105 (e.g., on respective signal pads of the semiconductor die 105). The conductive bumps or posts 107 can provide electrical connections (I/O and/or power supply voltage connections) to a circuit and/or electrical device (e.g., a semiconductor device, such as a power transistor, integrated circuit, etc.) that is implemented on the semiconductor die 105. The conductive bumps or posts 107 can include metal, solder, solder flux, copper and/or any suitable electrically conductive material or combination of materials.

In the FOWLP 100 of FIG. 1, the signal distribution structure (RDL) 135 can include electrical connections 139 and conductive bumps 143. The molding compound 125 can have via openings 141 formed therein, where a respective via opening 141 can be formed over each of the conductive bumps or posts 107 of the semiconductor die 105. In some implementations, the via openings 141 can be formed using laser ablation of the molding compound 125. For instance, the via openings 141 can be formed, using laser ablation, in conjunction with formation of the alignment mark(s) 150.

In the example of FIG. 1, the electrical connections 139 of the RDL 135 can be disposed on a planar surface of the molding compound and disposed in (and extend through) respective via openings 141 to electrically couple the electrical connections 139 with the conductive bumps or posts 107 (or signal pads of the semiconductor die 105). In some implementations, the electrical connections 139 can be formed by patterning a deposited conductive (metal) layer, e.g., using photolithography processes that use the alignment mark 150 (or a plurality of alignment marks) to align a corresponding photolithography mask or masks. In some implementations, the conductive bumps or posts 107 can be omitted (excluded, etc.) and the electrical connections 139 can be electrically coupled directly with the semiconductor die 105 (e.g., to signal pads of the semiconductor die 105) through the via openings 141 in the molding compound 125 (e.g., such as in the example implementations of FIGS. 8 and 9). In some implementations, a recess or multiple recesses can be formed (e.g., using laser ablation and in conjunction with forming the alignment mark 150) in the molding compound 125, and at least a portion of the RDL 135 can be disposed in the recess(es).

Figure 6C:
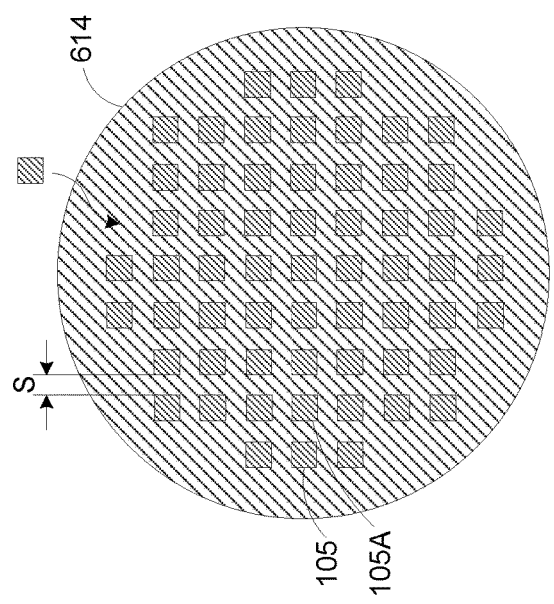
FIGS. 6A-6R are diagrams illustrating a process for producing a fan-out wafer level chip-scale package, according to an implementation.
Figure 6D:
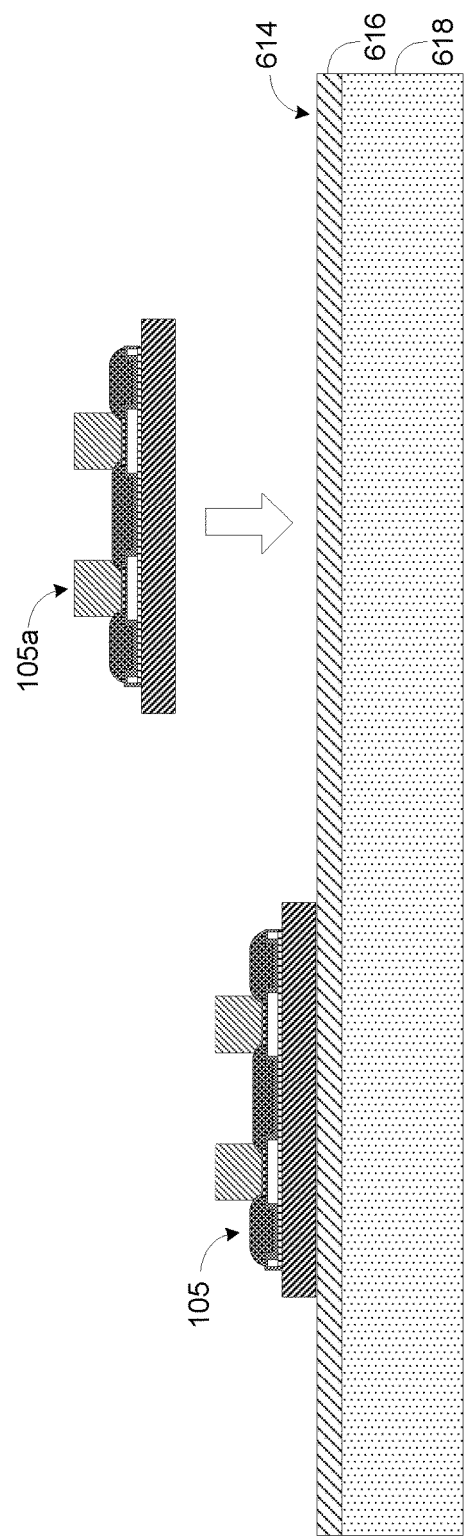
Figure 6E:
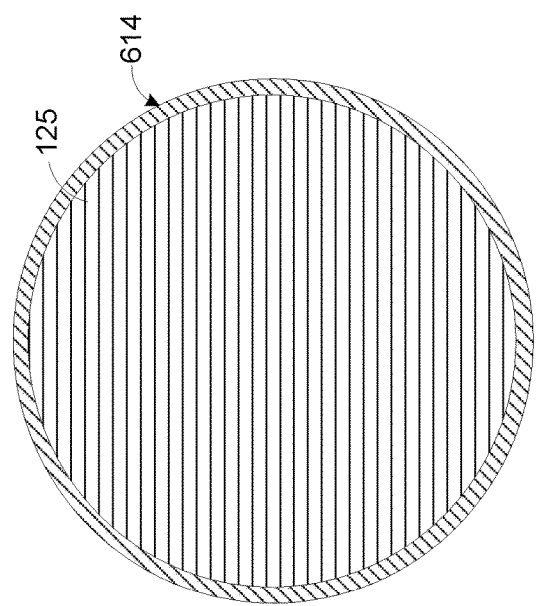
Figure 6F:
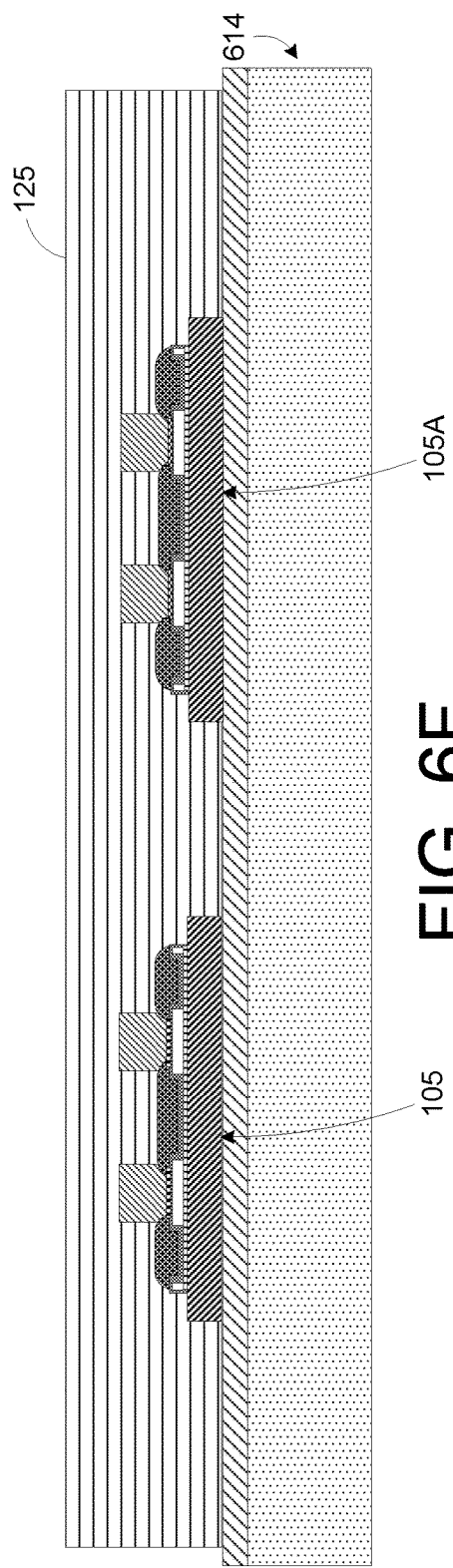
Figure 6I:
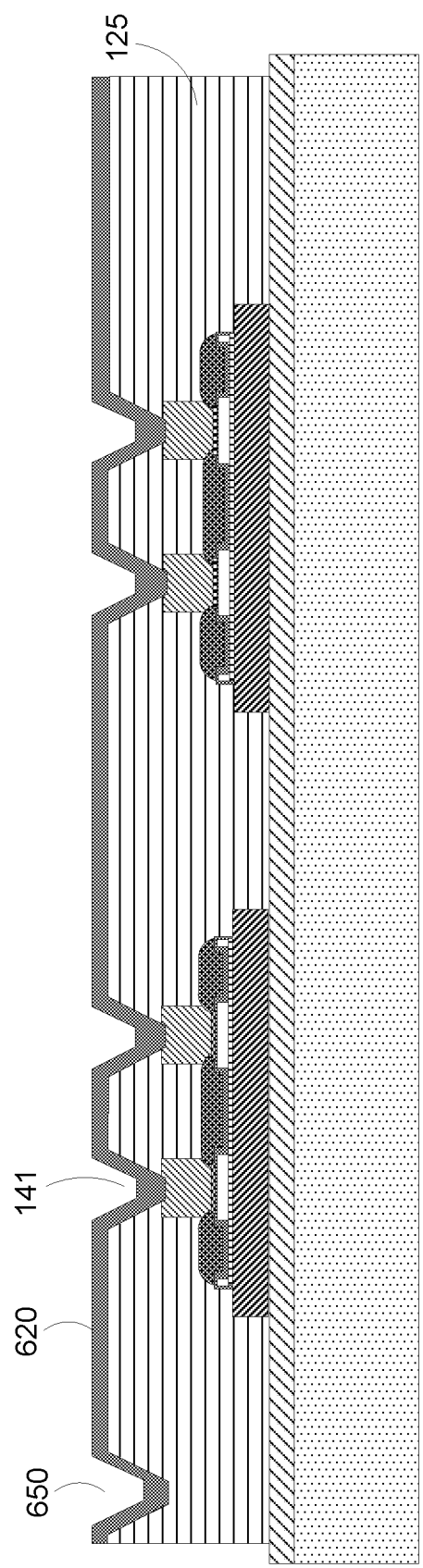
Figure 6J:
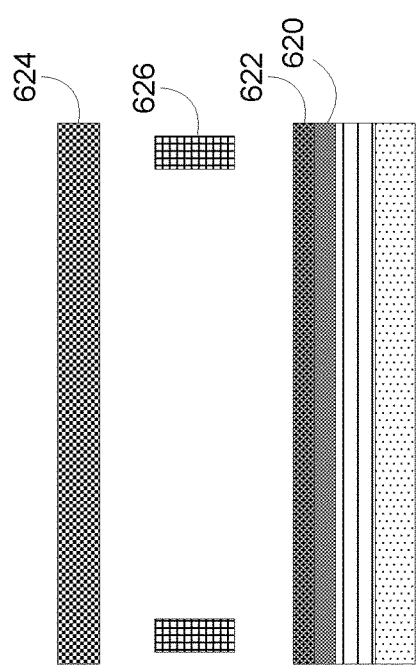
Figure 6K:
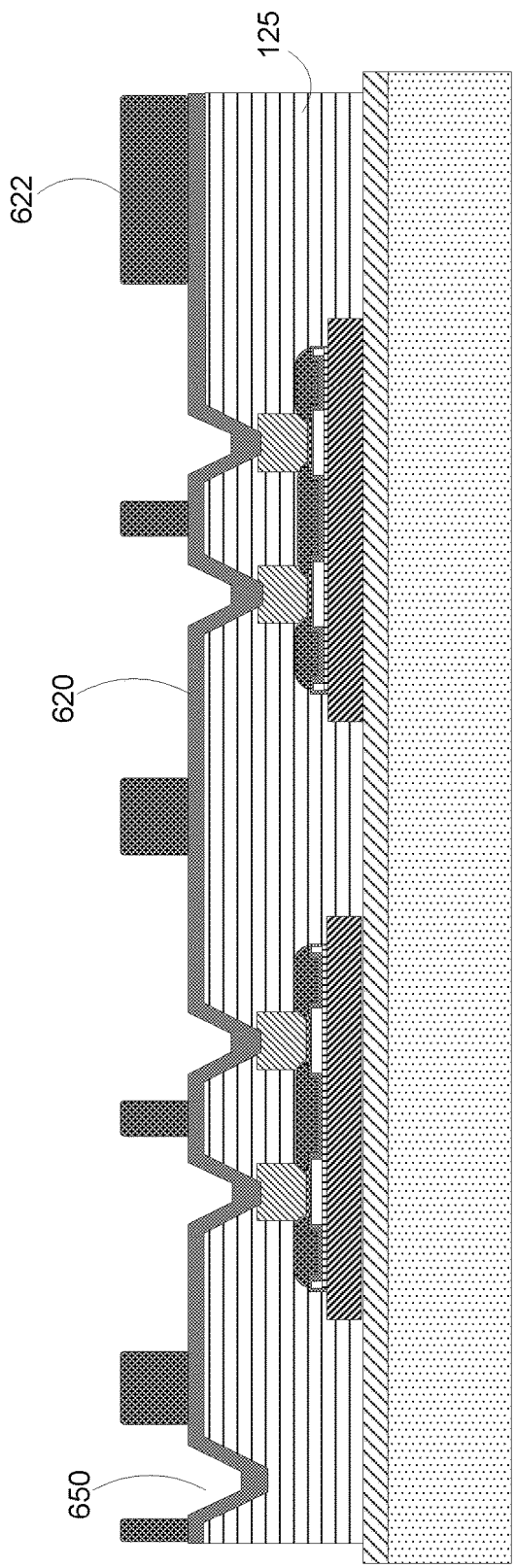
Figure 6L:
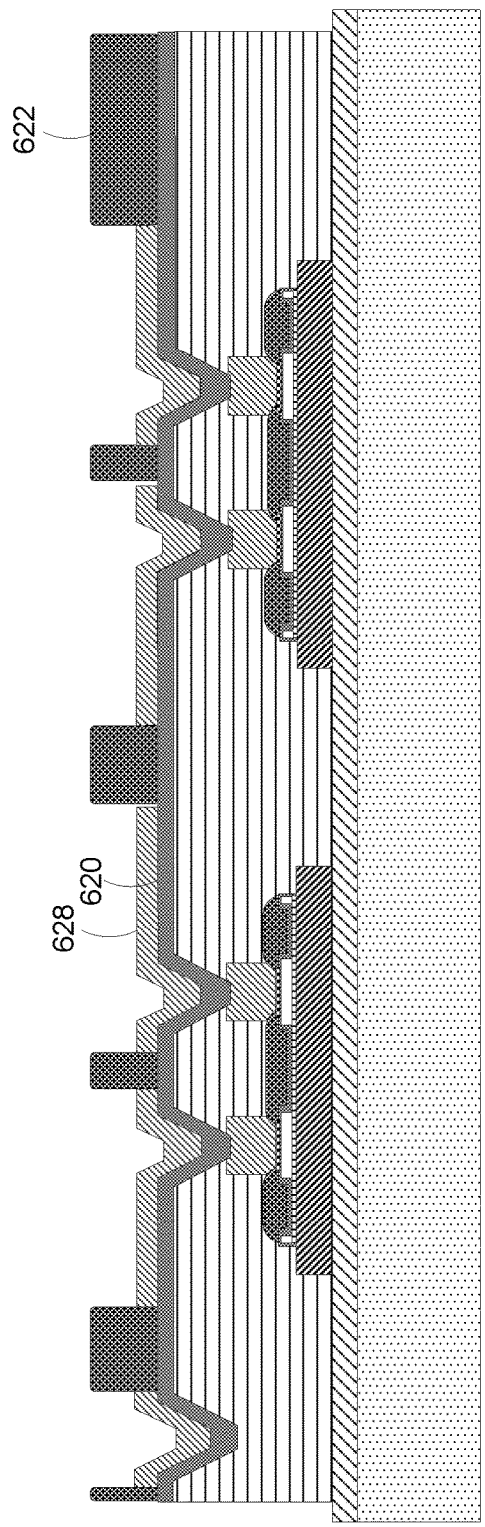
Figure 6M:
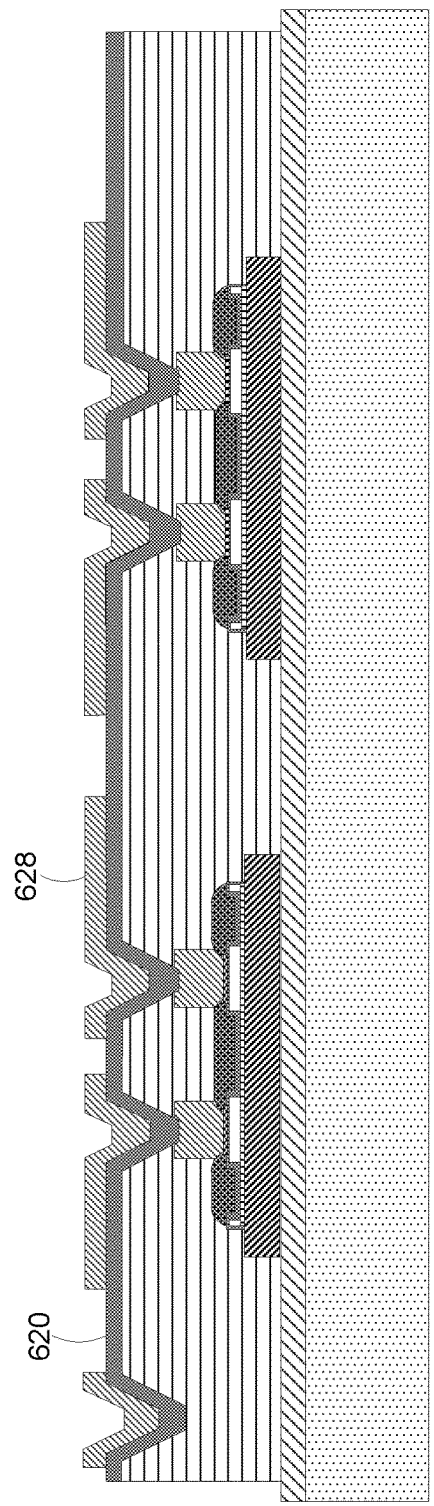
Figure 6N:
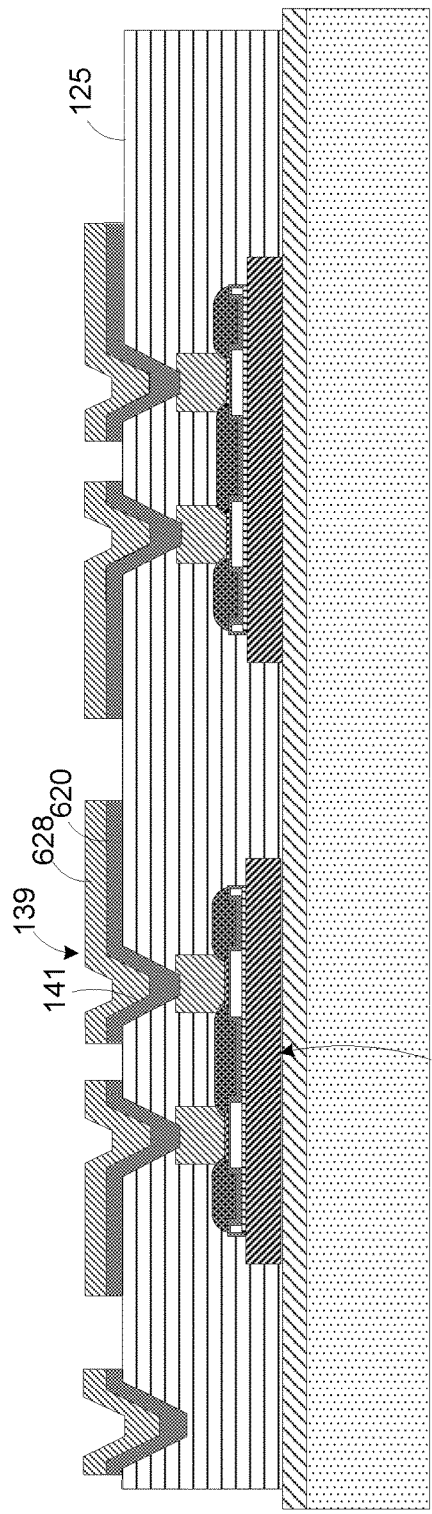
Figure 6O:
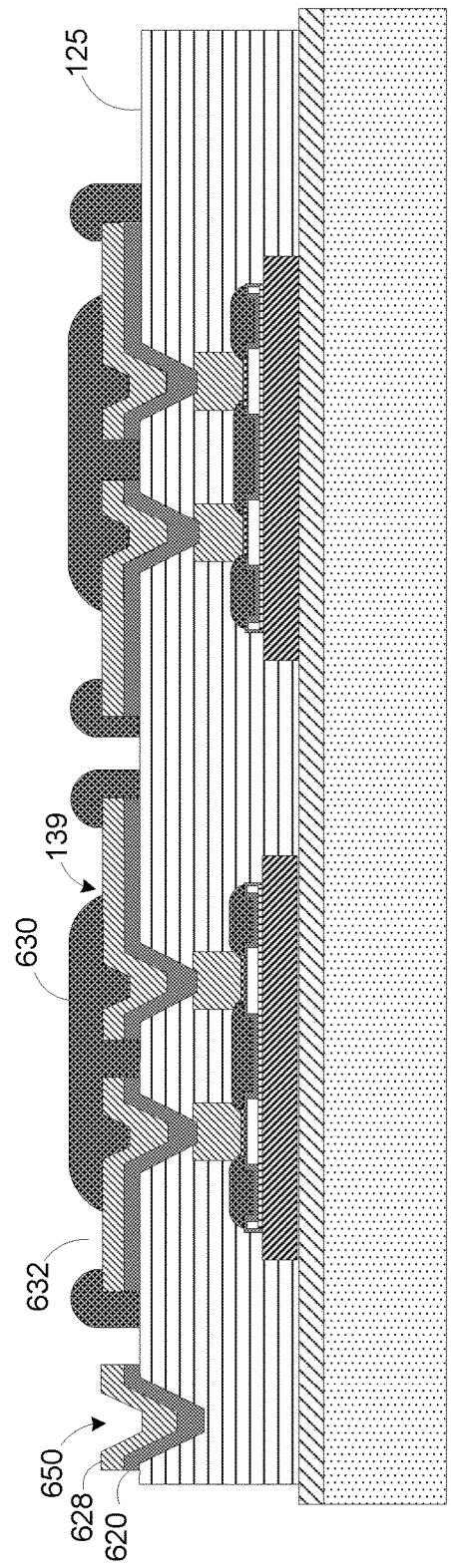
Figure 7E:
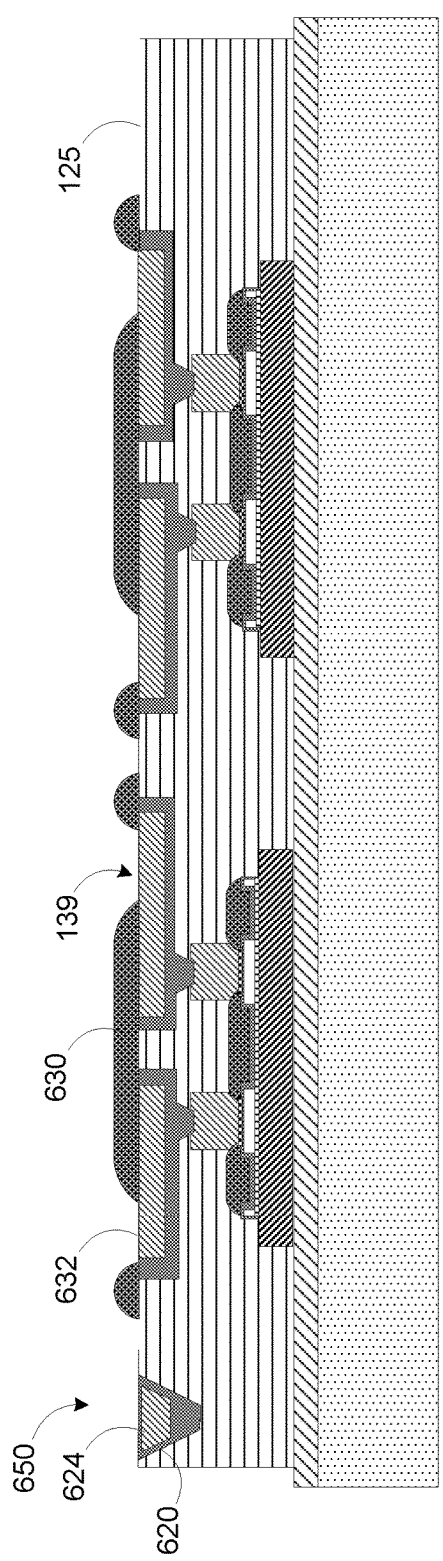

In the FOWLP 100 of FIG. 1, a solder resist or resin layer can be disposed on the molding compound 125 and the electrical connections 139 (e.g., such as shown in FIG. 6O and/or FIG. 7E). This solder resist or resin layer can have a planar (upper) surface, and can have via openings defined therein (e.g., by use of photolithography), where the conductive bumps 143 can each be disposed in a respective via opening through the solder resist or resin layer, such that the conductive bumps 143 provide respective electrical connections to each of the conductive bumps 107 of the semiconductor die 105, or signal pads of the semiconductor die 105 (e.g., through the electrical connections 139). The alignment mark 150 (alone, or in combination with one or more other alignment marks) can be used during such photolithography operations to align a photo mask (or photomasks) that are used to define features of the RDL, such as the via openings in the solder resist or resin layer discussed above.

Figure 2:
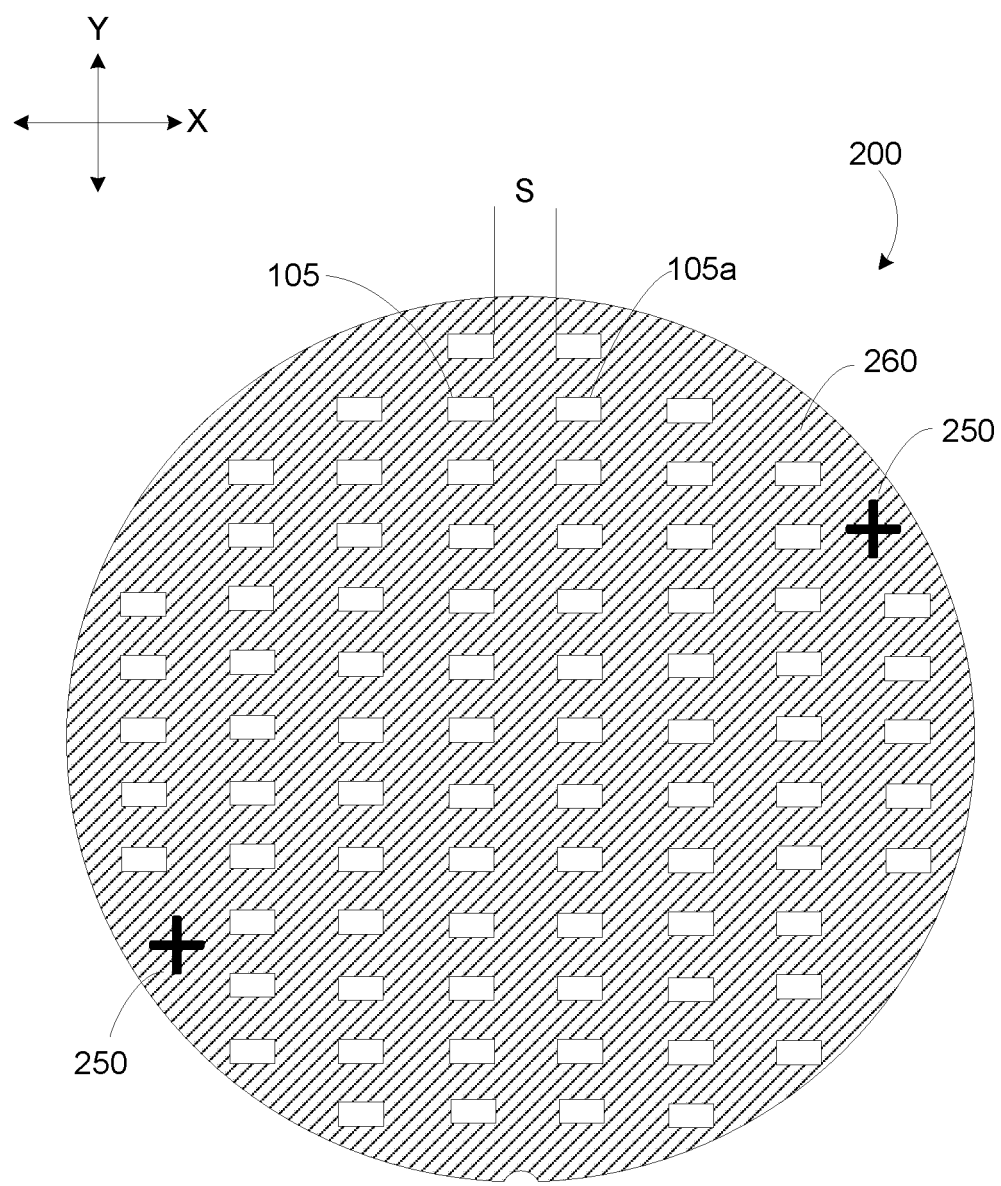
FIG. 2 is a diagram schematically illustrating a plurality of semiconductor die disposed on a carrier during a fan-out wafer level chip-scale packaging process, according to an implementation.

FIG. 2 is a schematic diagram illustrating a plurality of semiconductor die, e.g., semiconductor die 105 and 105a, disposed on a carrier (e.g., a substrate, a temporary substrate, etc.) 260 for fan-out wafer level packaging. In some implementations, the carrier 260 can include, for example, an adhesive sheet that is disposed on a temporary substrate (e.g., silicon, glass, resin, etc.), where the plurality of semiconductor die are disposed on the adhesive sheet. In some implementations, the semiconductor die, such as 105 and 105a can be placed on the carrier 260 after separation (singulation) of the plurality of semiconductor die, such as a using a pick-and-place operation. In this example, the semiconductor die can be placed on the carrier 260 with increased spacing S, as compared to their spacing after separation (singulation), to allow sufficient space for producing FOWLPs from the plurality of semiconductor die (e.g., for fanning-out the signal connections).

In some implementations, an adhesive layer of the carrier 260 can be a dicing tape, on which die singulation is performed. The dicing tape can then be stretched (e.g., along both the x-axis and the y-axis indicated in FIG. 2) to increase the spacing between the semiconductor die to the spacing S, e.g., so as to provide sufficient space between adjacent semiconductor die for producing FOWLPs from the semiconductor die (e.g., sufficient space to form respective RDLs for signal fan-out).

Also in FIG. 2, alignment features 250 are shown. In some implementations, the alignment features 250, as shown in FIG. 2, can indicate the locations of common alignment marks that will be formed (e.g., using laser ablation) after encapsulating the plurality of semiconductor die in a molding compound (e.g., an epoxy molding compound), such as by compression molding or print molding. The locations of the common alignment marks 250, in an example implementation, can be determined based on the locations of the semiconductor die on the carrier 260, where the semiconductor die locations can be determined using infrared imaging that is performed after a molding operation. In some implementations, the alignment features 250 can be alignment structures that are disposed on the carrier 260, where the locations of those alignment structures can be detected by infrared imaging (e.g., after molding). In such implementations, the detected locations of those alignment structures can then be used to determine locations of where to form (e.g., using laser ablation) one or more alignment marks in the molding compound, such as per semiconductor die alignment marks, and/or common (e.g., per carrier) alignment marks (e.g., such as in the locations of the alignment features 250 shown in FIG. 2).

FIGS. 3A and 3B are diagrams illustrating an alignment mark 300, according to an implementation. FIGS. 4A and 4B are diagrams illustrating another alignment mark 400, according to an implementation. FIGS. 5A and 5B are diagrams illustrating yet another alignment mark 500, according to an implementation. The alignment marks 300, 400 and 500 illustrated in FIGS. 3A-5B are shown by way of example, and for purposes of illustration. In some implementations, alignment marks having other configurations are possible, such as alignment marks that include different characters, shapes, patterns, etc. Also, in FIGS. 3A-5B, the example alignment marks 300, 400 and 500 are shown independent of a carrier having a plurality of semiconductor die encapsulated in a molding compound disposed thereon. That is, in FIGS. 3A-5B, only respective portions of a molding compound including the example alignments marks are shown.

FIGS. 3A, 4A and 5A illustrate top-side views of, respectively, the alignment marks 300, 400 and 500. FIGS. 3B, 4B and 5B illustrate side, sectioned views of, respectively, the alignment marks 300, 400 and 500. For instance, the section of the mark 300 shown in the sectioned view of FIG. 3B is indicated by the dashed lines 3B-3B in FIG. 3A. Similarly, the sections of the marks 400 and 500 shown in the sectioned views of FIGS. 4B and 5B are respectively indicated by the dashed lines 4B-4B in FIG. 4A and the dashed lines 5B-5B in FIG. 5A.

As illustrated in FIG. 3A, the alignment mark 300 is a + shaped alignment mark that can be formed by laser ablation of molding compound that is used to encapsulate a plurality of semiconductor die during a FOWLP manufacturing process, such as the manufacturing processes described herein. In the example of FIGS. 3A and 3B, laser ablation can be used to remove molding compound in a region 310 of the alignment mark 300 to define a region of molding compound 320 that is in a + shape. The side, sectioned view of FIG. 3B illustrates portions of the regions 310 and 320 of the section 3B-3B of the alignment mark 300 indicated in FIG. 3A.

As illustrated in FIG. 4A, the alignment mark 400 is also a + shaped alignment mark. However, as compared to the alignment mark 300, the alignment 400 is formed by laser ablation of a molding compound to remove molding compound in a + shaped region 410 of the alignment mark 400, such that a region 420 of the molding compound defines the + shape (e.g., defines the perimeter) of region 420. The side, sectioned view of FIG. 4B illustrates portions of the regions 410 and 420 of the section 4B-4B of the alignment mark 400 indicated in FIG. 4A.

As illustrated in FIG. 5A, the alignment mark 500 is an array (matrix, etc.) of four squares that are formed by laser ablation of a molding compound to remove molding compound in square-shaped regions 510 of the alignment mark 500, such that a region 520 of the molding compound defines the four squares of the alignment mark 500. The side, sectioned view of FIG. 5B illustrates portions of the regions 510 and 520 of the section 5B-5B of the alignment mark 500 indicated in FIG. 5A.

Figure 6R:
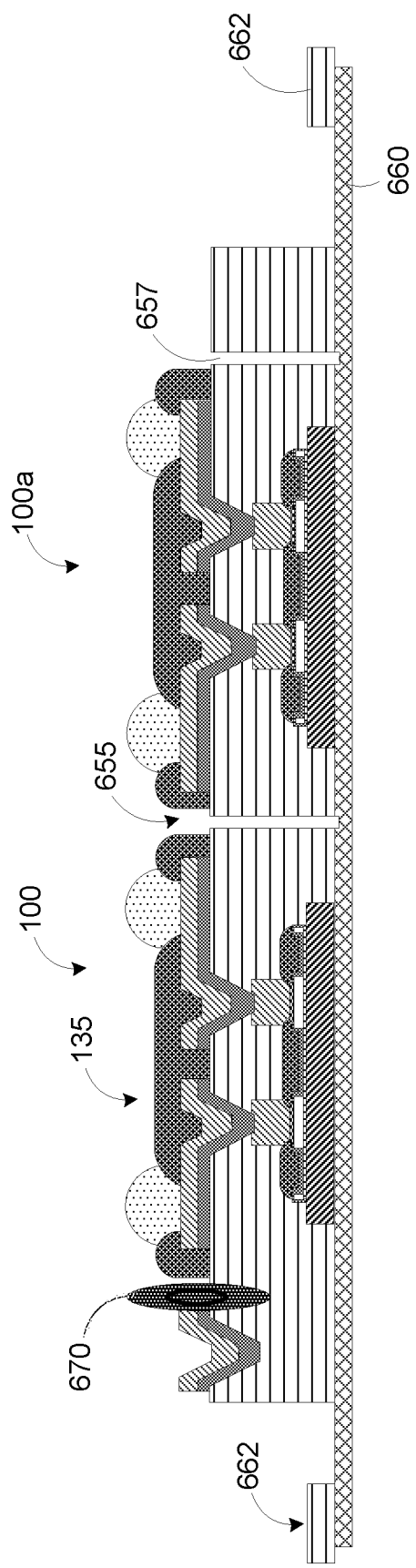

FIGS. 6A-6R are diagrams illustrating a process (a manufacturing process, etc.) for producing a FOWLP, such as the FOWLP 100 of FIG. 1, according to an implementation. The diagrams of FIGS. 6A-6R include top-down plan views (FIGS. 6A, 6C, 6E and 6G) and side views (FIGS. 6B, 6D, 6F and 6H-6R). These side views include fly-through (e.g. x-ray) views that show various elements of example FOWLPs, including elements that may be disposed internal to a FOWLP (e.g., would not be visible in an example implementation). These side views also include views that schematically illustrate respective process operations of the example FOWLP manufacturing process of FIGS. 6A-6R.

In some implementations, the process of FIGS. 6A-6R can be implemented to produce FOWLPs other than the FOWLP 100. For instance, the process of FIG. 6A-6R (or a similar process, such as the process of FIGS. 7A-7G) can be used to produce a FOWLP including multiple semiconductor die. In such a multiple semiconductor die FOWLP, an associated signal distribution layer or redistribution layer (RDL) can, in addition to providing external electrical connections (e.g., via conductive bumps 143), include electrical connections between the multiple semiconductor die included in such a FOWLP. In some implementations, other manufacturing processes can be used to produce a FOWLP, such as the FOWLPs described herein. However, for purposes of this disclosure and purposes of illustration, the manufacturing process illustrated in FIGS. 6A-6R is described below with further reference to the FOWLP 100 of FIG. 1.

Referring to FIG. 6A, a semiconductor wafer 600 is shown disposed on a wafer carrier 602. As shown in FIG. 6A, the semiconductor wafer 600 can include plurality of semiconductor die, such as the semiconductor 105 of the FOWLP 100 (and a semiconductor die 105a, similarly to FIG. 2). In some implementations, the wafer carrier 602 can include a wafer dicing tape (e.g., a stretchable wafer dicing tape), where the dicing tape can be disposed on a rigid substrate and/or coupled with a dicing ring (e.g., a dicing ring 607 as sectionally shown in the side view of FIG. 6B). In some implementations, the dicing ring 602, for example, can be disposed around a perimeter of the wafer carrier 620 (e.g., around a perimeter of a dicing tape). As shown in FIG. 6A, a cutting tool 604 (which can be a wafer saw, a laser, a plasma cutter, etc.) can be used to separate the plurality of semiconductor die into individual semiconductor die, such as the semiconductor die 105 and 105a while the semiconductor wafer 600 is disposed on the wafer carrier.

FIG. 6B illustrates, schematically, a side view of a portion of the semiconductor wafer 600 that includes the semiconductor die 105 and 105a. As shown in FIG. 6B, electrically conductive posts (e.g., copper posts) 107 can be respectively disposed on (coupled to, etc.) signal pads 606 of the semiconductor die 105 and 105a. For instance, with reference to the semiconductor die 105 for purposes of illustration, the conductive posts 107 can be disposed on the signal pads 606 through openings in a passivation (e.g., glass, dielectric, etc.) layer 608 of the semiconductor die 105. Depending on the particular implementation, the signal pads 606 can include aluminum, aluminum-copper, aluminum-silicon-copper, etc. The conductive posts 107 can be electrically connected with a circuit and/or semiconductor device that is defined on an active surface of the semiconductor die 105 using electrical (e.g., Ohmic) contacts with the conductive posts 107 and the signal pads 606. For purposes of clarity, such circuitry and/or semiconductor devices on the active surface of the semiconductor die 105 is/are not shown in FIGS. 6A-6R.

In some implementations, electrically conductive bumps (e.g., conductive bumps 107) can be implemented in place of the conductive pillars 107 shown in FIG. 6B. Such conductive bumps 107 can be disposed (formed, produced, etc.) on the active surface of the semiconductor die 105. For instance, the conductive bumps 107 can be disposed, in part, on the passivation layer 608, and can be electrically connected, via contact pads 606, with a circuit and/or semiconductor device that is defined on the active surface of the semiconductor die 105 using electrical (e.g., Ohmic) contacts that extend through the openings in the passivation layer 608 (e.g., through contact openings).

In some implementations, such conductive bumps 107 can include an underlying (first) conductive material, and a second conductive material that is disposed on the underlying conductive material. The second conductive material can be formed using evaporation, electrolytic plating, electroless plating, ball drop, and/or screen printing processes. In some implementations, the second conductive material can be aluminum (Al), tin (Sn), nickel (Ni), gold (Au), silver (Ag), lead (Pb), bismuth (Bi), copper (Cu), solder, and/or combinations thereof, and can further include a solder flux. In some implementations, the second conductive material can be eutectic Sn/Pb, high-lead solder, or lead-free solder.

In some implementations, the second conductive material of the conductive bumps 107 can be bonded to the underlying (first) conductive material using an attachment or bonding process. For instance, the second conductive material can be reflowed by heating the second conductive material above its melting point to form balls or bumps. In some implementations, the second conductive material can be reflowed a second time, which can improve electrical contact (e.g., reduce resistance) to the underlying (first) conductive material. Conductive bumps or posts 107, as described herein, are disclosed, by way of example, as two possible electrical interconnections that can be configured to provide electrical connections to circuitry formed on the active surface of the semiconductor die 105 (e.g., via signal pads 606). In some implementations, other approaches for providing such electrical connections can be used, such as conductive paste, stud bumps, micro bumps, or other electrical connections. In some implementations, such as the example implementations illustrated in FIGS. 8 and 9, electrical connections 139 of an RDL 135 can directly contact (e.g., form Ohmic contacts with) the signal pads of a corresponding semiconductor die included in a FOWLP.

As further shown in FIG. 6B, openings between the passivation layers 608 of the semiconductor die 105 and 105a can define scribe (saw) streets 610 between the semiconductor die of the semiconductor wafer 600. As shown in FIG. 6B, the semiconductor die 105 and 105a (as well as other semiconductor die included on the semiconductor wafer 600) can be singulated (separated along the scribe streets 610) as part of the FOWLP manufacturing process of FIGS. 6A-6R. For instance, the semiconductor die 105 can be singulated, e.g., from at least the semiconductor die 105a, by creating cut openings 612 through the semiconductor wafer 600 along the scribe streets 610. As noted above and illustrated in FIG. 6B, in some implementations, the cut openings 612 can be formed using a cutting tool 604, which can be a plasma etcher, a wafer saw, a laser cutting tool, etc. In some implementations, the semiconductor die 105 and 105a can remain affixed to the carrier 602 (e.g., a stretchable dicing tape), and the FOWLP manufacturing process can continue with stretching of the dicing tape, as discussed above with respect to FIG. 2, to increase spacing between the semiconductor die of the semiconductor wafer 600. In some implementations (such as illustrated in FIGS. 6C and 6D), the singulated semiconductor die of the semiconductor wafer 600 can be picked, and placed onto a separate carrier or tape, with increased spacing S (that is increases as compared to a spacing between semiconductor die after singulation), such as shown, for example, in FIGS. 2 and 6C.

Referring to FIGS. 6C and 6D, as noted above singulated semiconductor die, including the semiconductor die 105 and 105a, can be picked (from the singulated semiconductor wafer 600) and placed on a carrier 614 with spacing S, where the spacing S is sufficient for producing a fan-out RDL for the picked-and-placed semiconductor die. As shown in FIG. 6B, the carrier 614 can include an adhesive sheet 616 that is disposed on a substrate 618 (e.g., a temporary substrate). Depending on the particular implementation, the substrate 618 can be a silicon substrate, a glass substrate, a resin substrate, or any other appropriate substrate configured to support the adhesive layer 616 and the semiconductor die disposed on the adhesive layer 616 during fan-out wafer level processing.

As shown in FIGS. 6E and 6F, after increasing spacing between the singulated semiconductor die (e.g., using a pick-and-place process, stretching a dicing tape, etc.), a molding compound (encapsulant) 125 can be disposed (e.g., deposited, flowed, printed, etc.) over and between the semiconductor die on the carrier 614 (including the semiconductor die 105 and 105a). Depending on the particular implementation, the molding compound 125 can be formed (applied, etc.) using paste printing, compression molding, transfer molding, liquid encapsulant molding, vacuum lamination, film-assisted molding, spin coating, and/or any other suitable application process. The molding compound 125 can be a polymer, a polymer composite material, such as an epoxy resin with filler, an epoxy acrylate with filler, or a polymer with filler. The molding compound 125 can (should) be non-conductive, and provide physical support, and environmentally protect the semiconductor die from external elements and contaminants.

As shown in FIG. 6G, the semiconductor die disposed on the carrier 614 and encapsulated in the molding compound 125 can be imaged using, for example, infrared imaging to identify (determine, detect, etc.) the locations of the semiconductor die (including the semiconductor die 105 and 105a) and/or the location of alignment features 250 that can be included on (defined on, disposed on, etc.) the carrier 614, such as on the adhesive layer 616 that is coupled with the substrate 618.

As shown in FIG. 6H, the detected locations of the semiconductor die on the carrier 614 and/or the alignment features 250 can be used to determine locations to form (e.g., using laser ablation) alignment marks, such as an alignment mark 650, in the molding compound 125. Also, in some implementations, the detected locations of the semiconductor die and/or alignment features 250 of the carrier 614 can be used to determine locations to form (e.g., using laser ablation) via openings 141 in the molding compound 125, e.g., to expose the conductive bumps or posts 107 disposed on the semiconductor die 105 and 105a.

It is noted that, while a single alignment mark 650 is shown in FIG. 6H (as well as in the following FIGS. 6I-6R), additional alignment marks can be formed in the molding compound 125, such as an alignment mark per semiconductor die and/or one or more additional common alignment marks, such as in correspondence with the alignment features 250 shown in FIG. 6G. Further, the alignment mark 650 shown in FIGS. 6H-6R is schematically shown for purposes of illustration. Depending on the particular implementation, the alignment mark 650 (and other corresponding alignment marks formed in the molding compound 125) can take a number of forms, such as the forms of the example alignments marks illustrated in FIGS. 3A-5B and described above.

FIGS. 6I-6P illustrate formation of, for example, the signal distribution structure (the RDL) 135 of the FOWLP 100. As shown in FIG. 6I, after forming the alignment mark(s) 650 and the via openings 141 in the molding compound 125, a barrier metal layer 620 (which can also be referred to as a seed layer, or plating seed layer) can be formed on the surface of the molding compound 125, including on, and in the alignment mark(s) 650 and the via openings 141. That is, the barrier metal layer 620 can be disposed in the alignment marks 650 and in the via openings 141, as well as on an upper surface (in the orientation shown in FIG. 6I) of the molding compound 125. Depending on the particular implementation, the barrier metal layer 620 can be formed using a metal sputtering process and can include titanium, titanium-tungsten, copper, and/or any other appropriate material.

As illustrated in FIGS. 6J and 6K, after forming the barrier metal layer 620, a photolithography process can be performed to define a photoresist mask for plating the barrier metal layer 620 with a patterned conductive layer, such as to define the electrical connections 139 of the FOWLP 100, where the electrical connections 139 can each include respective portions of the barrier metal layer 620 and respective portions of the patterned conductive (plated or plating) layer 628 (such as shown in FIG. 6N).

As schematically illustrated in FIG. 6J, a photoresist layer 622 can be disposed (applied, spun, etc.) on the barrier metal layer 620. A photomask 624 can then be aligned, using visible light cameras 626, based on the location of the alignment mark(s) 650 (shown in FIG. 6K) that were formed in the molding compound 125.

As previously noted, such an approach can prevent misalignment that can occur where such alignment mark(s) 650 are not defined in the molding compound 125, as a visual alignment reference would not be available for alignment. Further, infrared imaging, after forming of the barrier metal layer 620, to identify locations of the semiconductor die and/or alignment features disposed within the molding compound 125 would be ineffective, as the barrier metal 620 would interfere with (block, etc.) infrared imaging of elements disposed within the molding compound 125.

The photoresist layer 622, as shown in FIG. 6K, can be patterned (e.g., using the photomask 624 and ultraviolet (UV) light) to define portions of the barrier metal layer 620 that are to be plated to form the electrical connections 139 of the RDL 135 of, for example, the FOWLP 100 of FIG. 1, where that patterning is aligned using the alignment mark(s) 650. In some implementations, alignment of the photolithography operation of FIGS. 6J and 6K (as well as other photolithography operations) can be further based on (aligned based on) the location of the via openings 141, in addition to the location(s) of the alignment mark(s) 650.

As shown in FIG. 6L, after patterning of the photoresist layer 622, as shown in FIG. 6K, a plating operation (e.g., an electroplating operation) can be performed to form a patterned conductive layer 628 on portions of the barrier metal layer 620 that are exposed through the patterned photoresist layer 622. In some implementations, the patterned conductive layer 628 can include copper, nickel, gold, tin, silver, and/or any other appropriate conductive materials.

As shown in FIG. 6M, after the plating operation of FIG. 6L, the patterned photoresist layer 622 can be removed, e.g., using reactive-ion etching, plasma etching, plasma ashing, or any other appropriate process for removing photoresist without etching (e.g., without significantly etching) the patterned conductive layer 628, such as using a photoresist remover (e.g. n-methylpyrrolidone (NMP), Dimethyl sulfoxide (DMSO), Tetramethylammonium hydroxide (TMAH), etc.). As shown in FIG. 6N, after removing the patterned photoresist layer 622, as shown in FIG. 6M, the portions of the barrier metal layer 620 that were not plated with the conductive layer 628 (e.g., were covered by the patterned photoresist layer 622) can be removed using an etch that is selective to the barrier metal layer 620, as compared to the patterned conductive (plating) layer 628. As is further shown in FIG. 6N, after removal of the un-plated portions of the barrier metal layer 620, in this example, the electrical connections 139 of the FOWLP are defined, where each electrical connection 139 includes a portion of the barrier metal layer 620 and a corresponding portion of the conductive (plating) layer 628. As noted above the electrical connections 139 defined by the process operations of, at least, FIGS. 6J-6N can provide electrical connections to the semiconductor die 105 (and other semiconductor die) via, e.g., portions of the electrical connections 139 disposed on the conductive posts or bumps 107 in the via openings 141 through the molding compound 125.

As shown in FIG. 6O, a solder resist layer 630 (which can be a resin layer, a dielectric layer, a non-conductive layer, etc.) can be formed on the electrical connections 139 and the molding compound 125. The solder resist layer 630 can be defined using photolithography processes that are aligned using the alignment mark(s) 650 (and can also be aligned based on the locations of the via openings 141). As shown in FIG. 6O, for example, the alignment mark(s) 650 can be covered with respective portions of the barrier metal layer 620 and the patterned conductive (plating) layer 628, but are still visually distinguishable using light in the visible spectrum.

As also shown in FIG. 6O, openings 632 can be defined (e.g., by corresponding photolithography operations) in the solder resist layer 630, where the openings 632 expose respective portions (e.g., planar portions) of the electrical connections 139. As shown in FIG. 6P, the conductive bumps 143 of the FOWLP can be formed in the openings 632, and on the respective exposed portions of the electrical connections 139, as well on portions of the solder resist layer 630 (e.g., portions of the solder resist layer surrounding the openings 632). The conductive bumps 143 can be formed, for example, using a solder ball drop process, a solder print process, and so forth.

Referring to FIG. 6Q, as compared to FIG. 6P, after forming the conductive bumps 143, the carrier 614 can be removed. In some implementations, removing the carrier 614 can include performing a UV light cure on the adhesive layer 616, which may allow the adhesive layer 616 and the substrate 618 of the carrier 614 to be easily removed from FOWLP devices that, in this example, respectively include the semiconductor die 105 and 105a. As shown in FIG. 6Q, after removal of the carrier 614, a backside (bottom side, etc.) of the semiconductor die 105 and 105a can be exposed through the molding compound 125. These exposed surfaces can be used to facilitate efficient cooling of the respective FOWLPs during operation. For instance, respective heatsinks (or other thermal dissipation devices) could be affixed to the exposed surfaces of, for example, the semiconductor die 105 and 105a to facilitate efficient heat dissipation during operation of semiconductor devices and/or circuits implemented on the semiconductor die 105 and 105a.

As shown in FIG. 6R, after removal of the carrier 614, as shown in FIG. 6P, the assembly illustrated in FIG. 6Q can be coupled with a dicing tape 660 that is coupled with (attached to, etc.) a dicing ring 662. Channels 657 can be formed along the saw streets 655 that are referenced in, for example, FIGS. 6Q and 6R. As shown in FIG. 6R, the channels 657 can be formed completely through the molding compound 125 and into the adhesive layer 660 to singulate the FOWLPs 100 and 100a from each other, as well as from other concurrently formed FOWLPs. For instance, the channels 657 can be formed in the molding compound 125 around each semiconductor die 105 and 105a (and around associated RDLs 135) using a cutting tool 670, which can be, e.g., a saw blade, a laser cutting tool, etc. In some embodiments, as noted above, more than one semiconductor die 105, or semiconductor die of different sizes and types can be combined into each singulated FOWLP 100 and 100a (as well as additional FOWLPs). After singulation, the FOWLPs 100 and 100a can be removed from the dicing tape 660 (e.g., after a UV cure of the dicing tape 660), and then can be electrically tested for proper functionality.

FIGS. 7A-7G are diagrams illustrating operations of another process (a manufacturing process, etc.) for producing a FOWLP, such as the FOWLP 100 of FIG. 1, according to an implementation. A process including the operations of FIGS. 7A-7G can also include the same operations, or similar operations, as those illustrated in FIGS. 6A-6G (as well as those illustrated in FIGS. 6H-6R) and described above. That is, in some implementations, the process of FIGS. 7A-7G can begin after the operation of FIG. 6G (e.g., using infrared imaging to identify locations of semiconductor die and/or other alignment features 250 within a molding compound 125). Accordingly, for purposes of brevity, the details of the operations of FIGS. 6A-6G are not repeated again here. Further, for purposes of clarity and comparison of the manufacturing flow of FIGS. 7A-7G with the manufacturing flow of FIG. 6A-6R, similar or like elements in FIGS. 7A-7G as the elements of FIGS. 6A-6R are referenced with the same reference numbers as in FIGS. 6A-6R. The diagrams of FIGS. 7A-7G include fly-through (e.g. x-ray) side views that show various elements of example FOWLPs, including elements that may be disposed internal to a FOWLP (e.g., would not be visible in an example implementation). These side views also include some views that schematically illustrate respective process operations of the example FOWLP manufacturing process operations of FIGS. 7A-7G.

As shown in FIG. 7A, the detected locations of the semiconductor die on the carrier 614 and/or the alignment features 250 (e.g., in FIG. 6G) can be used to determine locations to form (e.g., using laser ablation) alignment marks, such as an alignment mark 650, in the molding compound 125. Also, in some implementations, the detected locations of the semiconductor die and/or alignment features 250 of the carrier 614 can be used to determine locations to form (e.g., using laser ablation) via openings 141 in the molding compound 125, e.g., to expose the conductive bumps or posts 107 disposed on the semiconductor die 105 and 105a. As further shown in FIG. 7A, the detected locations of the semiconductor die disposed on the carrier 614 and/or alignment features 250 of the carrier 614 can be used to determine locations to form (e.g., using laser ablation) one or more recesses 702 in the molding compound 125, where at least portions of the electrical connections 139 of the FOWLP 100 can be disposed in the recesses 702.

As with FIG. 6H, it is noted that, while a single alignment mark 650 is shown in FIG. 7A (as well as in the following FIGS. 7B-7G), additional alignment marks 650 can be formed in the molding compound 125, such as an alignment mark per semiconductor die and/or one or more additional common alignment marks, such as in correspondence with the alignment features 250 shown in FIG. 6G. Further, the alignment mark 650 shown in FIGS. 7A-7G is schematically shown for purposes of illustration. Depending on the particular implementation, the alignment mark 650 (and other corresponding alignment marks formed in the molding compound 125) can take a number of forms, such as the forms of the example alignments marks illustrated in FIGS. 3A-5B and described above.

FIGS. 7B-7F illustrate formation of, for example, the signal distribution structure 135 of the FOWLP 100 in this example. As shown in FIG. 7B, after forming the alignment mark(s) 650, the via openings 141 and the recesses 702 in the molding compound 125, a barrier metal layer 620 (which can also be referred to as a seed layer, or plating seed layer) can be formed on the surface of the molding compound 125, including on, and in the alignment mark(s) 650, in the via openings 141 and in the recesses 702. That is, the barrier metal layer 620 can be disposed in the alignment marks 650, disposed in the via openings 141 and disposed in the recesses 702, as well as disposed on an upper surface (in the orientation shown in FIG. 7B) of the molding compound 125. As in FIG. 6I, depending on the particular implementation, the barrier metal layer 620 in FIG. 7B can be formed using a metal sputtering process and can include titanium, titanium-tungsten, copper, and/or any other appropriate material.

As illustrated in FIG. 7C, after forming of the barrier metal layer 620, a plating operation (e.g., an electroplating operation) can be performed to form a conductive plating layer 628 on the barrier metal layer 620. In some implementations, the conductive plating layer 628 can include copper, nickel, gold, tin, silver, and/or any other appropriate conductive materials.

As shown in FIG. 7D, after the plating operation of FIG. 7C, a grinding operation (e.g., a topside grinding operation, a front-side grinding operation, etc.) can be performed to remove portions of the conductive plating layer 628 and the barrier metal layer 620 that are not included in the electrical connections 139 (of an associated RDL), or disposed in the alignment marks 650. In some implementations, chemical-mechanical polishing (CMP) can also be used to remove portions of the conductive plating layer 628 and the barrier metal layer 620. As is shown in FIG. 7D, after the grinding and/or CMP operations, in this example, the electrical connections 139 of the FOWLP 100 are defined, where each electrical connection 139 includes a portion of the barrier metal layer 620 and a corresponding portion of the conductive (plating) layer 628. The electrical connections 139 defined by the process operations of, at least, FIGS. 7B-7D can provide electrical connections to the semiconductor die 105 (and other semiconductor die) via, e.g., portions of the electrical connections 139 disposed in the recesses 702 in the molding compound, disposed on the conductive posts or bumps 107, and disposed in the via openings 141 through the molding compound 125.

As shown in FIG. 7E, similar to FIG. 6O, a solder resist layer 630 (which can be a resin layer, a dielectric layer, a non-conductive layer, etc.) can be formed on the electrical connections 139 and the molding compound 125. The solder resist layer 630 can be defined using photolithography processes that are aligned using the alignment mark(s) 650 (and can also be aligned based on the locations of the electrical connections 139 in the recesses 702). As shown in FIG. 7E, for example, the alignment mark(s) 650 can be covered with respective portions of the barrier metal layer 620 and the conductive plating layer 628, but are still visually distinguishable using light in the visible spectrum.

As previously noted, such an approach can prevent misalignment that can occur where such alignment mark(s) 650 are not defined in the molding compound 125, as a visual alignment reference that is based on alignment structures and/or location of semiconductor die within the molding compound would not be available for photolithography alignment purposes. Further, infrared imaging, after forming of the barrier metal layer 620 and forming the conductive plating layer 628, e.g., to identify locations of the semiconductor die and/or alignment features disposed within the molding compound, would be ineffective, as the barrier metal 620 and/or the conductive plating layer 628 would interfere with (block, etc.) infrared imaging of elements disposed within the molding compound 125.

Figure 7F:
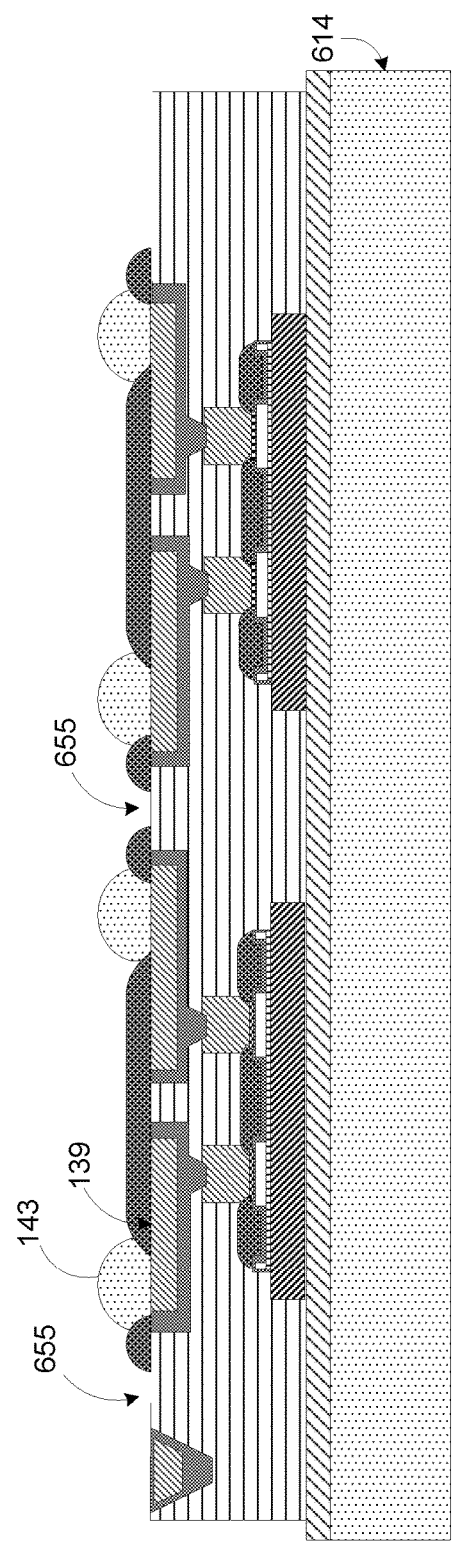

As also shown in FIG. 7E, openings 632 can be defined (e.g., by the corresponding photolithography operations) in the solder resist layer 630, where the openings 632 expose respective portions (e.g., planar portions) of the electrical connections 139. As shown in FIG. 7F, the conductive bumps 143 of the FOWLP 100 can be formed in the openings 632, and on the respective exposed portions of the electrical connections 139, as well on portions of the solder resist layer 630 (e.g., portions of the solder resist layer surrounding the openings 632). The conductive bumps 143 can be formed, for example, using a solder ball drop process, a solder print process, and so forth.

Referring to FIG. 7G, as compared to FIG. 7F, after forming the conductive bumps 143, the carrier 614 can be removed. In some implementations, removing the carrier 614 can include performing a UV light cure on the adhesive layer 616, which may allow the adhesive layer 616 and the substrate 618 of the carrier 614 to be easily removed from FOWLP devices that, in this example, respectively include the semiconductor die 105 and 105a. As also shown in FIG. 7G, after removal of the carrier 614, a backside (bottom side, etc.) of the semiconductor die 105 and 105a can be exposed through the molding compound 125, which, as discussed above, can be used to facilitate efficient cooling of the respective FOWLPs during operation.

As still further shown in FIG. 7G, after removal of the carrier 614, the assembly produced can be coupled with a dicing tape 660 that is coupled with (attached to, etc.) a dicing ring 662. As in FIG. 6R, in FIG. 7G, channels 657 can be formed along the saw streets 655 that are referenced in, for example, FIGS. 7F and 7G. As shown in FIG. 7G, the channels 657 can be formed completely through the molding compound 125 and into the adhesive layer 660 to singulate the FOWLPs 100 and 100a from each other, as well as from other concurrently formed FOWLPs. For instance, the channels 657 can be formed in (and through) the molding compound 125 around each semiconductor die 105 and 105a (and around associated RDLs 135) using a cutting tool 670, which can be, e.g., a saw blade, a laser cutting tool, etc. In some embodiments, as noted above, more than one semiconductor die 105, or different sizes and types of semiconductor die can be combined into each singulated FOWLP 100 and 100a (as well as additional FOWLPs). After singulation, the FOWLPs 100 and 100a can be removed from the dicing tape 660 (e.g., after a UV cure of the dicing tape 660), and can then be electrically tested for proper functionality.

FIG. 8 is a diagram illustrating a fan-out, wafer-level chip-scale package (a FOWLP or FOWLCSP) 800 that can be produced using the method of FIGS. 6A-6R, according to an implementation. As compared to the FOWLPs illustrated in FIGS. 6A-6R, the FOWLP 800 excludes the conductive bumps or posts 107. As shown in FIG. 8, electrical connections 139 (e.g., including portions of the barrier metal layer 620 and portions of a patterned conductive plating layer 628) are directly disposed on the signal pads 606 of the semiconductor die 105. That is, in the FOWLP 800, Ohmic contacts may be formed between respective portion of the electrical connection 139 disposed in the via openings 141 and corresponding signal pads 606 of the semiconductor die.

FIG. 9 is a diagram illustrating a chip-scale package that can be produced using the method of FIGS. 7A-7G, according to an implementation. FIG. 9 is a diagram illustrating a fan-out, wafer-level chip-scale package (a FOWLP or FOWLCSP) 900 that can be produced using the method of FIGS. 7A-7G, according to an implementation. As compared to the FOWLPs illustrated in FIGS. 7A-7G, the FOWLP 900 excludes the conductive bumps or posts 107. As shown in FIG. 9, electrical connections 139 (e.g., including portions of the barrier metal layer 620 and portions of a conductive plating layer 628) are directly disposed on the signal pads 606 of the semiconductor die 105. That is, in the FOWLP 900, as with the FOWLP 800, Ohmic contacts may be formed between respective portions of the electrical connection 139 disposed in the via openings 141 and corresponding signal pads 606 of the semiconductor die.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, Silicon (Si), Gallium Arsenide (GaAs), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method of producing a fan-out wafer level package (FOWLP) semiconductor device, the method comprising:
    separating a semiconductor wafer into a plurality of semiconductor die;
    after separating the semiconductor wafer into the plurality of semiconductor die, increasing spacing between adjacent semiconductor die of the plurality of semiconductor die;
    encapsulating, in a molding compound, the plurality of semiconductor die;
    determining respective locations of a plurality of alignment features disposed within the molding compound; and
    forming, based on the determined respective locations, at least one alignment mark in the molding compound.

2. The method of claim 1, wherein forming the at least one alignment mark includes forming the at least one alignment mark using laser ablation.

3. The method of claim 1, further comprising, for at least one semiconductor die of the plurality of semiconductor die, forming, using laser ablation, a via opening through the molding compound to expose an electrical connection to the at least one semiconductor die.

4. The method of claim 3, wherein the electrical connection to the at least one semiconductor die includes one of:
    a signal pad of the at least one semiconductor die;
    a conductive bump disposed on a signal pad of the at least one semiconductor die; and
    a conductive pillar disposed on a signal pad of the at least one semiconductor die.

5. The method of claim 1, wherein forming the at least one alignment mark includes forming a respective alignment mark for each semiconductor die of the plurality of semiconductor die.

6. The method of claim 1, wherein determining the respective locations of the plurality of alignment features includes determining the respective locations using infrared imaging.

7. The method of claim 1, wherein the plurality of alignment features includes at least one semiconductor die of the plurality of semiconductor die.

8. The method of claim 1, further comprising, for at least one semiconductor die of the plurality of semiconductor die, forming a signal distribution structure, the signal distribution structure being disposed on the molding compound, and disposed in at least one via opening through the molding compound to establish an electrical connection to the semiconductor die.

9. The method of claim 8, further comprising, in conjunction with forming the at least one alignment mark, forming, by laser ablation:
    the at least one via opening; and
    a recessed region in the molding compound, at least a portion of the signal distribution structure being disposed in the recessed region.

10. The method of claim 8, wherein the signal distribution structure is configured to provide respective electrical connections to a plurality of conductive bumps or conductive posts disposed on the at least one semiconductor die.

11. The method of claim 8, wherein the signal distribution structure is configured to provide respective electrical connections to a plurality of signal pads of the at least one semiconductor die.

12. The method of claim 1, further comprising:
    prior to separating the semiconductor wafer into the plurality of semiconductor die, disposing the semiconductor wafer on a first carrier,
    wherein increasing spacing between adjacent semiconductor die of the plurality of semiconductor die includes, after separating the semiconductor wafer into the plurality of semiconductor die:
    picking the plurality of semiconductor die off the first carrier; and
    placing the plurality of semiconductor die on a second carrier with the increased spacing.

13. The method of claim 1, further comprising:
    prior to separating the semiconductor wafer into the plurality of semiconductor die, disposing the semiconductor wafer on a carrier tape,
    wherein increasing spacing between adjacent die of the plurality of semiconductor die includes, after separating the semiconductor wafer into the plurality of semiconductor die, stretching the carrier tape along a first axis of the carrier tape and along a second axis of the carrier tape,
    the method further comprising placing the stretched carrier tape on a substrate.

14. A method of producing a fan-out wafer level package (FOWLP) semiconductor device, the method comprising:

separating a semiconductor wafer into a plurality of semiconductor die;

after separating the semiconductor wafer into the plurality of semiconductor die, increasing spacing between adjacent semiconductor die of the plurality of semiconductor die, the plurality of semiconductor die being disposed on a wafer carrier;

encapsulating, in a molding compound, the plurality of semiconductor die;

determining, using infrared imaging, respective locations of a plurality of alignment features disposed within the molding compound; and forming, using laser ablation and based on the determined respective locations:
- at least one alignment mark in the molding compound; and
- a plurality of via openings to expose respective electrical connections of the plurality of semiconductor die.

15. The method of claim 14, wherein the plurality of alignment features include at least one alignment structure disposed on the wafer carrier on which the plurality of semiconductor die are disposed.

16. The method of claim 14, further comprising, for a semiconductor die of the plurality of semiconductor die, forming a signal distribution structure, the signal distribution structure being disposed on the molding compound, and disposed in at least one via opening through the molding compound to form an electrical connection to the semiconductor die of the plurality of semiconductor die.

17. The method of claim 16, wherein the electrical connection to the semiconductor die of the plurality of semiconductor die includes one of:
- a signal pad of the semiconductor die of the plurality of semiconductor die;
- a conductive bump disposed on a signal pad of the semiconductor die of the plurality of semiconductor die; and
- a conductive pillar disposed on a signal pad of the semiconductor die of the plurality of semiconductor die.

18. A method of producing a fan-out wafer level package (FOWLP) semiconductor device, the method comprising:

separating a semiconductor wafer into a plurality of semiconductor die;

after separating the semiconductor wafer into the plurality of semiconductor die, increasing spacing between adjacent semiconductor die of the plurality of semiconductor die, the plurality of semiconductor die being disposed on a wafer carrier;

encapsulating, in a molding compound, the plurality of semiconductor die;

determining, using infrared imaging, respective locations of a plurality of alignment features disposed within the molding compound;

forming, using laser ablation and based on the determined respective locations:
- at least one alignment mark in the molding compound;
- a plurality of via openings to expose respective electrical connections of the plurality of semiconductor die; and
- at least one recessed region in the molding compound; and for at least one semiconductor die of the plurality of semiconductor die, forming a signal distribution structure, the signal distribution structure being disposed on the molding compound, and disposed in at least one via opening through the molding compound, at least a portion of the signal distribution structure being disposed in the at least one recessed region.

19. The method of claim 18, wherein forming the at least one alignment mark includes forming a respective alignment mark for each semiconductor die of the plurality of semiconductor die.

20. The method of claim 18, wherein the plurality of alignment features includes at least one semiconductor die of the plurality of semiconductor die.

* * * * *